United States Patent
Naito et al.

(10) Patent No.: US 11,621,299 B2
(45) Date of Patent: Apr. 4, 2023

(54) COMPOSITION AND METHOD FOR PRODUCING COMPOSITION

(71) Applicant: Sumitomo Chemical Company, Limited, Tokyo (JP)

(72) Inventors: Shota Naito, Tsukuba (JP); Takashi Arimura, Tsukuba (JP); Yoshiaki Sakatani, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 638 days.

(21) Appl. No.: 16/612,970

(22) PCT Filed: May 17, 2018

(86) PCT No.: PCT/JP2018/019025
§ 371 (c)(1),
(2) Date: Nov. 12, 2019

(87) PCT Pub. No.: WO2018/212260
PCT Pub. Date: Nov. 22, 2018

(65) Prior Publication Data
US 2020/0168666 A1 May 28, 2020

(30) Foreign Application Priority Data
May 17, 2017 (JP) .............................. JP2017-097961

(51) Int. Cl.
*H01L 27/32* (2006.01)
*C08J 5/18* (2006.01)
*C08L 83/16* (2006.01)
*H01L 33/50* (2010.01)

(52) U.S. Cl.
CPC ............... *H01L 27/32* (2013.01); *C08J 5/18* (2013.01); *C08L 83/16* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 2011/0190432 A1 | 8/2011 | Tanabe | |
| 2011/0311881 A1 | 12/2011 | Benicewicz | |
| 2015/0166751 A1 | 6/2015 | Fukumoto et al. | |
| 2015/0188006 A1 | 7/2015 | Williams et al. | |
| 2017/0278640 A1* | 9/2017 | Hayakawa | H01L 51/448 |

(Continued)

FOREIGN PATENT DOCUMENTS

| | | |
|---|---|---|
| CN | 102131732 A | 7/2011 |
| CN | 104379340 A | 2/2015 |

(Continued)

OTHER PUBLICATIONS

Extended European Search Report issued in corresponding European Patent Application No. 18803139.7 dated May 11, 2020.
(Continued)

*Primary Examiner* — Jas A Sanghera
(74) *Attorney, Agent, or Firm* — Morgan, Lewis & Bockius LLP

(57) ABSTRACT

The present disclosure relates to a composition including a light-emitting perovskite compound (1) which includes constituent components A, B, and X, and a silazane or modified product thereof (2).

20 Claims, 1 Drawing Sheet

(56) References Cited

U.S. PATENT DOCUMENTS

| | | | |
|---|---|---|---|
| 2017/0369776 A1* | 12/2017 | Luchinger | H01L 33/504 |
| 2020/0165397 A1* | 5/2020 | Arimura | C09K 11/0883 |
| 2020/0243732 A1* | 7/2020 | Naito | G02B 5/20 |
| 2021/0061829 A1* | 3/2021 | Naito | H01L 33/50 |

FOREIGN PATENT DOCUMENTS

| | | |
|---|---|---|
| CN | 104388089 A | 3/2015 |
| CN | 105789451 A | 7/2016 |
| EP | 3184602 A1 | 6/2017 |
| EP | 3216842 A1 | 9/2017 |
| JP | H04-171696 A | 6/1992 |
| JP | 2001-303037 A | 10/2001 |
| JP | 2007-077246 A | 3/2007 |
| JP | 2017-025219 A | 2/2017 |
| JP | 6103183 B | 3/2017 |
| WO | 2016/187448 A1 | 11/2016 |

OTHER PUBLICATIONS

International Search Report issued in corresponding International Patent Application No. PCT/JP2018/019025 dated Jun. 19, 2018.

Office Action issued in corresponding Chinese Patent Application No. 201880000794.8 dated May 21, 2019.

Sun et al., "Efficient and Stable White LEDs with Silica-Coated Inorganic Perovskite Quantum Dots," Advanced Materials, 28: 10088-10094 (2016).

Nien et al., "Synthesis of nano-scaled yttrium aluminum garnet phosphor by co-precipitation method with HMDS treatment," Materials Chemistry and Physics, 93: 79-83 (2005).

Nien et al., "Photoluminescence Enhancement of Y3Al5O12:Ce Nanoparticles Using HMDS," Journal of the American Ceramic Society, 91 (11): 3599-3602 (2008).

* cited by examiner

COMPOSITION AND METHOD FOR PRODUCING COMPOSITION

TECHNICAL FIELD

The present invention relates to a composition and a method for producing a composition.

Priority is claimed on Japanese Patent Application No. 2017-097961, filed on May 17, 2017, the content of which is incorporated herein by reference.

BACKGROUND ART

In recent years, a perovskite compound having a high quantum yield has been attracting attention as a light-emitting material. In addition, a light-emitting material is required to have stability, and a composition that contains a perovskite compound coated with 3-aminopropyltriethoxysilane has been reported as a composition containing a perovskite compound (Non-Patent Document 1).

CITATION LIST

Patent Literature

[Non-Patent Document 1] Advanced Materials 2016, 28, p. 10088 to 10094

DISCLOSURE OF INVENTION

Technical Problem

However, the durability of the composition containing a perovskite compound described in Non-Patent Document 1 with respect to water vapor is not necessarily sufficient.

The present invention has been made in consideration of the above-described problem, and an object thereof is to provide a composition which has a high initial quantum yield and excellent durability with respect to water vapor and contains a perovskite compound; and a method for producing the composition.

Solution to Problem

As the result of intensive examination conducted by the present inventors in order to solve the above-described problem, it was found that a composition containing a perovskite compound, and a silazane or a modified product of silazane has durability with respect to water vapor. It is considered that the durability with respect to water vapor is improved by formation of a protected region in the vicinity of the perovskite compound due to the silazane or the modified product thereof.

The composition is considered to have a high quantum yield by reducing the number of defective sites on the surface of the perovskite compound using the silazane or the modified product thereof and reducing the probability of excited electrons being trapped in the defective sites.

In other words, embodiments of the present invention include the following inventions [1] to [13].

[1] A light-emitting composition including: a perovskite compound (1) which includes constituent components A, B, and X; and a silazane or modified product thereof (2).

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

[2] The composition according to [1], in which the silazane or modified product thereof (2) is a polysilazane or a modified product thereof.

[3] The composition according to [1] or [2], further including: at least one selected from the group consisting of a solvent (3) and a polymerizable compound or polymer (4).

[4] The composition according to any one of [1] to [3], further including: at least one compound or ion (5) selected from the group consisting of ammonia, an amine, a carboxylic acid, and salts and ions thereof.

[5] A composition including: a perovskite compound (1) which includes constituent components A, B, and X; a silazane or modified product thereof (2); and a polymer (4'), in which a total content ratio of the perovskite compound (1), the silazane or modified product thereof (2), and the polymer (4') is 90% by mass or greater with respect to the total mass of the composition.

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

[6] The composition according to [5], further including: at least one compound or ion (5) selected from the group consisting of ammonia, an amine, a carboxylic acid, and salts and ions thereof.

[7] A film which is formed of the composition according to [5] or [6].

[8] A laminated structure including: the film according to [7].

[9] A light-emitting device including: the laminated structure according to [8].

[10] A display including: the laminated structure according to [8].

[11] A method for producing a composition, including: a step of dispersing a perovskite compound (1) which includes constituent components A, B, and X in a solvent (3) to obtain a dispersion liquid; and a step of mixing the dispersion liquid with a silazane or modified product thereof (2).

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

[12] A method for producing a composition, including: a step of dispersing a perovskite compound (1) which includes constituent components A, B, and X in a solvent (3) to obtain a dispersion liquid; a step of mixing the dispersion liquid with a polymerizable compound or polymer (4) to obtain a mixed solution; and a step of mixing the mixed solution with a silazane or modified product (2).

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

[13] A method for producing a composition, including: a step of dispersing a perovskite compound (1) which includes constituent components A, B, and X in a solvent (3) to obtain a dispersion liquid; a step of mixing the dispersion liquid with a silazane (2') to obtain a mixed solution; a step of performing a modification treatment on the mixed solution to obtain a mixed solution containing a modified product of silazane; and a step of mixing the mixed solution containing the modified product of silazane with a polymerizable compound or polymer (4).

(the constituent component A indicates a component positioned at each vertex of a hexahedron having the constituent component B at the center in a perovskite type crystal structure and is a monovalent cation, the constituent component X indicates a component positioned at each vertex of an octahedron having the constituent component B at the center in the perovskite type crystal structure and is at least one anion selected from the group consisting of a halide ion and a thiocyanate ion, and the constituent component B indicates a component positioned at the centers of the hexahedron where the constituent component A is disposed at each vertex and the octahedron where the constituent component X is disposed at each vertex in the perovskite type crystal structure and is a metal ion.)

Advantageous Effects of Invention

According to the present invention, it is possible to provide a composition which has a high initial quantum yield and excellent durability with respect to water vapor and contains a perovskite compound; and a method for producing the composition.

BEST MODE FOR CARRYING OUT THE INVENTION

Figure 1:
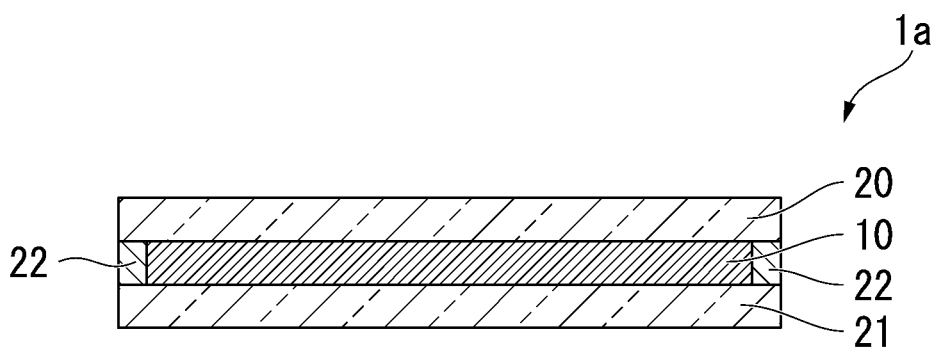
FIG. 1 is a cross-sectional view showing an embodiment of a laminated structure according to the present invention.

Hereinafter, the present invention will be described in detail based on embodiments.

<Composition>

A composition according to the present embodiment has a light-emitting property. The "light-emitting property" indicates a property of emitting light. As the light-emitting property, a property of emitting light using excitation of electrons is preferable, and a property of emitting light using excitation of electrons caused by excitation light is more preferable. The wavelength of excitation light may be, for example, in a range of 200 nm to 800 nm, in a range of 250 nm to 750 nm, or in a range of 300 nm to 700 nm.

The composition according to the present embodiment contains a perovskite compound (1) containing constituent components A, B, and X and a silazane or modified product thereof (2).

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is at least one anion selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

The composition of the present embodiment may be a composition containing the compound (1) and the silazane or modified product thereof (2) or may contain components other than the compound (1) and the silazane or modified product thereof (2).

For example, the composition of the present embodiment may further include at least one selected from the group consisting of a solvent (3) or a polymerizable compound or polymer (4).

It is preferable that the compound (1) is dispersed in at least one selected from the group consisting of the solvent (3) and the polymerizable compound or polymer (4).

The composition according to the present embodiment may further include at least one compound or ion (5) selected from the group consisting of ammonia, an amine, a carboxylic acid, and salts or ions thereof.

The composition according to the present embodiment may further include components other than the above-described components (1) to (5).

Examples of other components include a small amount of impurities and a compound having an amorphous structure formed of an element component constituting the perovskite compound, and a polymerization initiator.

The content ratio of other components is preferably 10% by mass or less, more preferably 5% by mass or less, and still more preferably 1% by mass or less with respect to the total mass of the composition.

The composition may be a composition which contains the compound (1), the silazane or modified product thereof (2), and a polymer (4') and in which the total content ratio of the compound (1), the silazane or modified product thereof (2), and the polymer (4') is 90% by mass or greater with respect to the total mass of the composition. In the composition according to the present embodiment, it is preferable that the compound (1) is dispersed in the polymer (4').

In the composition according to the present embodiment, the total content ratio of the compound (1), the silazane or modified product thereof (2), and the polymer (4') may be 95% by mass or greater, 99% by mass or greater, or 100% by mass with respect to the total mass of the composition.

The composition according to the present embodiment may contain a compound or ion (5) and may also contain the same components as other components described above as the components other than the compound (1), the silazane or modified product thereof (2), the polymer (4'), and the compound or ion (5).

In the composition according to the embodiment which contains the compound (1), the silazane or modified product thereof (2), and at least one selected from the group consisting of the solvent (3), and the polymerizable compound or polymer (4), the content ratio of the compound (1) with respect to the total mass of the composition is not particularly limited. However, from the viewpoints of making the perovskite compound difficult to be condensed and preventing the concentration quenching, the content ratio thereof is preferably 50% by mass or less, more preferably 1% by mass or less, and still more preferably 0.1% by mass or less. Further, from the viewpoint of obtaining an excellent quantum yield, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the compound (1) with respect to the total mass of the composition is typically in a range of 0.0001% to 50% by mass.

The content ratio of the compound (1) with respect to the total mass of the composition is preferably in a range of 0.0001% to 1% by mass, more preferably in a range of 0.0005% to 1% by mass, and still more preferably in a range of 0.001% to 0.5% by mass.

From the viewpoints of making the compound (1) difficult to aggregate and exhibiting an excellent light-emitting property, a composition in which the content ratio of the compound (1) with respect to the total mass of the composition is in the above-described range is preferable.

In the composition according to the embodiment which contains the compound (1), the silazane or modified product thereof (2), and at least one selected from the group consisting of the solvent (3), and the polymerizable compound or polymer (4), the content ratio of the silazane or modified product thereof (2) with respect to the total mass of the composition is not particularly limited. However, from the viewpoints of improving the dispersibility of the compound (1) and improving the durability, the content ratio thereof is preferably 30% by mass or less, more preferably 10% by mass or less, and still more preferably 7.5% by mass or less. Further, from the viewpoint of improving the durability, the content ratio thereof is preferably 0.001% by mass or greater, more preferably 0.01% by mass or greater, and still more preferably 0.1% by mass or greater.

The above-described upper limit and lower limit can be combined as desired.

The content ratio of the silazane or modified product thereof (2) with respect to the total mass of the composition is typically in a range of 0.001% to 30% by mass.

The content ratio of the silazane or modified product thereof (2) with respect to the total mass of the composition is preferably in a range of 0.01% to 10% by mass, more preferably in a range of 0.1% to 7.5% by mass, and still more preferably in a range of 0.2% to 7.0% by mass.

From the viewpoint of improving the durability, a composition in which the content ratio of the silazane or modified product thereof (2) with respect to the total mass of the composition is in the above-described range is preferable.

In the composition according to the embodiment which contains the compound (1), the silazane or modified product thereof (2), and at least one selected from the group consisting of the solvent (3), and the polymerizable compound or polymer (4), the total content ratio of the compound (1) and the silazane or modified product thereof (2) with respect to the total mass of the composition is not particularly limited. However, from the viewpoints of making the perovskite compound difficult to be condensed and preventing the concentration quenching, the content ratio thereof is preferably 60% by mass or less, more preferably 40% by mass or less, still more preferably 30% by mass or less, and particularly preferably 20% by mass or less. Further, from the viewpoint of obtaining an excellent quantum yield, the content ratio thereof is preferably 0.0002% by mass or greater, more preferably 0.002% by mass or greater, and still more preferably 0.005% by mass or greater.

The above-described upper limit and lower limit can be combined as desired.

The total content ratio of the compound (1) and the silazane or modified product thereof (2) with respect to the total mass of the composition is typically in a range of 0.0002% to 60% by mass.

The total content ratio of the compound (1) and the silazane or modified product thereof (2) with respect to the total mass of the composition is preferably in a range of 0.001% to 40% by mass, more preferably in a range of 0.002% to 30% by mass, and still more preferably in a range of 0.005% to 20% by mass.

From the viewpoints of making the compound (1) difficult to aggregate and exhibiting an excellent light-emitting property, a composition in which the content ratio of the compound (1) and the silazane and modified product thereof (2) with respect to the total mass of the composition is in the above-described range is preferable.

Further, in the composition according to the embodiment which contains the compound (1), the silazane or modified product thereof (2), and at least one selected from the group consisting of the solvent (3), and the polymerizable compound or polymer (4), the total content ratio of the compound (1), the silazane or modified product thereof (2), and at least one of the solvent (3), and the polymerizable compound or polymer (4) may be 90% by mass or greater, 95% by mass or greater, 99% by mass or greater, or 100% by mass with respect to the total mass of the composition.

In the composition according to the embodiment which contains the compound (1), the silazane or modified product thereof (2), the compound or ion (5), and at least one of selected from the group consisting of the solvent (3), and the polymerizable compound or polymer (4), the content ratio of the compound (1) with respect to the total mass of the composition is not particularly limited. However, from the viewpoints of making the compound (1) difficult to be condensed and preventing the concentration quenching, the content ratio thereof is preferably 50% by mass or less, more preferably 2% by mass or less, and still more preferably 1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the compound (1) with respect to the total mass of the composition is typically in a range of 0.0001% to 50% by mass.

The content ratio of the compound (1) with respect to the total mass of the composition is preferably in a range of 0.0001% to 2% by mass, more preferably in a range of 0.0005% to 1% by mass, and still more preferably in a range of 0.001% to 1% by mass.

From the viewpoints of making the compound (1) difficult to aggregate and exhibiting an excellent light-emitting property, it is preferable that the content ratio related to the formulation of the compound (1) in the composition is in the above-described range.

In the composition according to the embodiment which contains the compound (1), the silazane or modified product thereof (2), the compound or ion (5), and at least one selected from the group consisting of the solvent (3), and the polymerizable compound or polymer (4), the content ratio of the silazane or modified product thereof (2) with respect to the total mass of the composition is not particularly limited. However, from the viewpoint of improving the dispersibility of the compound (1), the content ratio thereof is preferably 50% by mass or less, more preferably 30% by mass or less, and still more preferably 7% by mass or less. Further, from the viewpoint of improving the durability, the content ratio thereof is preferably 0.0001% by mass or greater, more preferably 0.01% by mass or greater, and still more preferably 0.1% by mass or greater.

The above-described upper limit and lower limit can be combined as desired.

The content ratio of the silazane or modified product thereof (2) with respect to the total mass of the composition is typically in a range of 0.0001% to 30% by mass.

The content ratio of the silazane or modified product thereof (2) with respect to the total mass of the composition is preferably in a range of 0.01% to 15% by mass, more preferably in a range of 0.1% to 10% by mass, and still more preferably in a range of 0.2% to 7% by mass.

From the viewpoint of improving the durability of the compound (1), it is preferable that the content ratio related to the formulation of the silazane or modified product thereof (2) in the composition is in the above-described range.

In the composition according to the embodiment which contains the compound (1), the silazane or modified product thereof (2), the compound or ion (5), and at least one selected from the group consisting of the solvent (3), and the polymerizable compound or polymer (4), the total content ratio of the compound (1) and the silazane or modified product thereof (2) with respect to the total mass of the composition is not particularly limited. However, from the viewpoints of making the perovskite compound difficult to be condensed and preventing the concentration quenching, the content ratio thereof is preferably 95% by mass or less, more preferably 30% by mass or less, and still more preferably 10% by mass or less. Further, from the viewpoint of obtaining excellent emission intensity, the content ratio thereof is preferably 0.0005% by mass or greater, more preferably 0.001% by mass or greater, and still more preferably 0.005% by mass or greater.

The above-described upper limit and lower limit can be combined as desired.

The total content ratio of the compound (1) and the silazane or modified product thereof (2) with respect to the total mass of the composition is preferably in a range of 0.0005% to 95% by mass, more preferably in a range of 0.005% to 30% by mass, and still more preferably in a range of 0.001% to 10% by mass.

From the viewpoint of making the compound (1) difficult to aggregate and exhibiting an excellent light-emitting property, the composition in which the content ratio of the compound (1) and the silazane or modified product thereof (2) with respect to the total mass of the composition is in the above-described range is preferable.

The above-described upper limit and lower limit can be combined as desired.

Further, in the composition according to the embodiment which contains the compound (1), the silazane or modified product thereof (2), the compound or ion (5), and at least one of the solvent (3), and the polymerizable compound or polymer (4), the total content ratio of the compound (1), the silazane or modified product thereof (2), the compound or ion (5), and at least one selected from the group consisting of the solvent (3), and the polymerizable compound or polymer (4) may be 90% by mass or greater, 95% by mass or greater, 99% by mass or greater, or 100% by mass with respect to the total mass of the composition.

In the composition according to the embodiment which contains the compound (1), the silazane or product thereof (2), and the polymer (4') and in which the total content ratio of the compound (1), the silazane or product thereof (2), and the polymer (4') is 90% by mass or greater, the content ratio of the compound (1) with respect to the total mass of the composition is not particularly limited. However, from the viewpoints of making the compound (1) difficult to be condensed and preventing the concentration quenching, the content ratio thereof is preferably 50% by mass or less, more preferably 1% by mass or less, and still more preferably 0.1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the compound (1) with respect to the total mass of the composition is typically in a range of 0.0001% to 50% by mass.

The content ratio of the compound (1) with respect to the total mass of the composition is preferably in a range of 0.0001% to 1% by mass, more preferably in a range of 0.0005% to 1% by mass, and still more preferably in a range of 0.001% to 0.5% by mass.

From the viewpoint of exhibiting an excellent light-emitting property, it is preferable that the content ratio related to the formulation of the compound (1) in the composition is in the above-described range.

In the composition according to the embodiment which contains the compound (1), the silazane or product thereof (2), and the polymer (4') and in which the total content ratio of the compound (1), the silazane or product thereof (2), and the polymer (4') is 90% by mass or greater, the content ratio of the silazane or product thereof (2) with respect to the total mass of the composition is not particularly limited. However, from the viewpoints of making the compound (1) difficult to aggregate and preventing the concentration quenching, the content ratio thereof is preferably 30% by mass or less, more preferably 15% by mass or less, and still more preferably 7% by mass or less. Further, from the viewpoint of obtaining excellent emission intensity, the content ratio thereof is preferably 0.001% by mass or greater, more preferably 0.01% by mass or greater, and still more preferably 0.1% by mass or greater.

The above-described upper limit and lower limit can be combined as desired.

The content ratio of the silazane or product thereof (2) with respect to the total mass of the composition is typically in a range of 0.001% to 30% by mass.

The content ratio of the silazane or product thereof (2) with respect to the total mass of the composition is preferably in a range of 0.01% to 15% by mass, more preferably in a range of 0.1% to 10% by mass, and still more preferably in a range of 0.2% to 7% by mass.

From the viewpoint of improving the durability of the compound (1), it is preferable that the content ratio related to the formulation of the silazane or modified product thereof (2) in the composition is in the above-described range.

In the composition according to the embodiment which contains the compound (1), the silazane or product thereof (2), and the polymer (4') and in which the total content ratio of the compound (1), the silazane or product thereof (2), and the polymer (4') is 90% by mass or greater, the total content ratio of the compound (1) and the silazane or modified product thereof (2) with respect to the total mass of the composition is not particularly limited. However, from the viewpoints of making the compound (1) difficult to be condensed and preventing the concentration quenching, the content ratio thereof is preferably 60% by mass or less, more preferably 40% by mass or less, still more preferably 30% by mass or less, and particularly preferably 20% by mass or less. Further, from the viewpoint of obtaining an excellent quantum yield, the content ratio thereof is preferably 0.0002% by mass or greater, more preferably 0.002% by mass or greater, and still more preferably 0.005% by mass or greater.

The above-described upper limit and lower limit can be combined as desired.

The content ratio of the compound (1) and the silazane or product thereof (2) with respect to the total mass of the composition is typically in a range of 0.0002% to 60% by mass.

The total content ratio of the compound (1) and the silazane or modified product thereof (2) with respect to the total mass of the composition is preferably in a range of 0.001% to 40% by mass, more preferably in a range of 0.002% to 30% by mass, and still more preferably in a range of 0.005% to 20% by mass.

From the viewpoint of exhibiting an excellent light-emitting property, a composition in which the content ratio of the compound (1) and the silazane and modified product thereof (2) with respect to the total mass of the composition is in the above-described range is preferable.

The embodiment of the present invention relates to a composition containing the compound (1), the silazane or modified product thereof (2), the compound or ion (5), and the polymer (4'), and the total content ratio of the compound (1), the silazane or modified product thereof (2), the compound or ion (5), and the polymer (4') may be 90% by mass or greater with respect to the total mass of the composition.

In the composition according to the embodiment which contains the compound (1), the silazane or modified product thereof (2), the compound or ion (5), and the polymer (4'), the compound (1), the silazane or modified product thereof (2), and the compound or ion (5) may be dispersed in the polymer (4').

In the composition according to the embodiment which contains the compound (1), the silazane or modified product thereof (2), the compound or ion (5), and the polymer (4') and in which the total content ratio of the compound (1), the silazane or modified product thereof (2), and the polymer (4') is 90% by mass or greater, the content ratio of the compound (1) with respect to the total mass of the composition is not particularly limited. However, from the viewpoints of making the compound (1) difficult to aggregate and preventing the concentration quenching, the content ratio thereof is preferably 50% by mass or less, more preferably 2% by mass or less, and still more preferably 1% by mass or less. Further, from the viewpoint of obtaining excellent emission intensity, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the compound (1) with respect to the total mass of the composition is typically in a range of 0.0001% to 50% by mass.

The content ratio of the compound (1) with respect to the total mass of the composition is preferably in a range of 0.0001% to 2% by mass, more preferably in a range of 0.0005% to 1% by mass, and still more preferably in a range of 0.001% to 1% by mass.

From the viewpoints of making the compound (1) difficult to aggregate and exhibiting an excellent light-emitting property, it is preferable that the content ratio related to the formulation of the compound (1) in the composition is in the above-described range.

In the composition according to the embodiment which contains the compound (1), the silazane or modified product thereof (2), the compound or ion (5), and the polymer (4') and in which the total content ratio of the compound (1), the silazane or modified product thereof (2), and the polymer (4') is 90% by mass or greater, the content ratio of the silazane or modified product thereof (2) with respect to the total mass of the composition is not particularly limited. However, from the viewpoint of improving the dispersibility of the compound (1), the content ratio thereof is preferably 30% by mass or less, more preferably 15% by mass or less, and still more preferably 10% by mass or less. Further, from the viewpoint of improving the durability, the content ratio thereof is preferably 0.0001% by mass or greater, more preferably 0.0005% by mass or greater, and still more preferably 0.001% by mass or greater.

The above-described upper limit and lower limit can be combined as desired.

The content ratio of the silazane or modified product thereof (2) with respect to the total mass of the composition is typically in a range of 0.0001% to 30% by mass.

The content ratio of the silazane or modified product thereof (2) with respect to the total mass of the composition is preferably in a range of 0.0001% to 15% by mass, more preferably in a range of 0.0005% to 10% by mass, and still more preferably in a range of 0.001% to 7% by mass.

From the viewpoint of improving the durability of the compound (1), it is preferable that the content ratio related to the formulation of the silazane or modified product thereof (2) in the composition is in the above-described range.

In the composition according to the embodiment which contains the compound (1), the silazane or modified product thereof (2), the compound or ion (5), and the polymer (4') and in which the total content ratio of the compound (1), the silazane or modified product thereof (2), and the polymer (4') is 90% by mass or greater, the total content ratio of the compound (1) and the silazane or modified product thereof (2) with respect to the total mass of the composition is not particularly limited. However, from the viewpoints of making the perovskite compound difficult to be condensed and preventing the concentration quenching, the content ratio thereof is preferably 95% by mass or less, more preferably 30% by mass or less, and still more preferably 15% by mass or less. Further, from the viewpoint of obtaining an excellent quantum yield, the content ratio thereof is preferably 0.0005% by mass or greater, more preferably 0.001% by mass or greater, and still more preferably 0.005% by mass or greater.

The above-described upper limit and lower limit can be combined as desired.

The total content ratio of the compound (1) and the silazane or modified product thereof (2) with respect to the total mass of the composition is preferably in a range of 0.0005% to 95% by mass, more preferably in a range of 0.005% to 30% by mass, and still more preferably in a range of 0.001% to 15% by mass.

From the viewpoint of making the compound (1) difficult to aggregate and exhibiting an excellent light-emitting property, a composition in which the content ratio of the compound (1) and the silazane or modified product thereof (2) with respect to the total mass of the composition is in the above-described range.

The above-described upper limit and lower limit can be combined as desired.

Further, in the composition which contains the compound (1), the silazane or modified product thereof (2), the compound or ion (5), and the polymer (4'), the total content ratio of the compound (1), the silazane or modified product thereof (2), the compound or ion (5), and the polymer (4') may be 90% by mass or greater, 95% by mass or greater, 99% by mass or greater, or 100% by mass with respect to the total mass of the composition.

Hereinafter, the composition will be described based on embodiments of the present invention.

Perovskite compound (1) including constituent components A, B, and X

The average particle diameter of the compound (1) contained in the composition is not particularly limited, but the average particle diameter thereof is preferably 1 nm or greater, more preferably 2 nm or greater, and still more preferably 3 nm or greater from the viewpoint of satisfactorily maintaining the crystal structure. Further, the average particle diameter thereof is preferably 10 µm or less, more preferably 1 µm or less, and still more preferably 500 nm or less from the viewpoint of making the perovskite compound (1) difficult to be settled out.

The above-described upper limit and lower limit can be combined as desired.

The average particle diameter of the compound (1) contained in the composition is not particularly limited, but the average particle diameter thereof is preferably in a range of 1 nm to 10 µm, more preferably in a range of 2 nm to 1 µm, and still more preferably 3 nm to 500 nm from the viewpoints of making the perovskite compound (1) difficult to be settled out and satisfactorily maintaining the crystal structure.

In the present specification, the average particle diameter of the perovskite compound contained in the composition can be measured using, for example, a transmission electron microscope (hereinafter, also referred to as a TEM) and a scanning electron microscope (hereinafter, also referred to as a SEM). Specifically, the average particle diameter can be acquired by observing the maximum Feret diameter of twenty perovskite compounds contained in the composition using a TEM or a SEM and calculating the average maximum Feret diameter which is an average value of the obtained values. The "maximum Feret diameter" in the present specification indicates the maximum distance between two straight lines parallel to each other which interpose the perovskite compound therebetween on a TEM or SEM image.

The median diameter (D50) of the compound (1) contained in the composition is not particularly limited, but the median diameter (D50) thereof is preferably 3 nm or greater, more preferably 4 nm or greater, and still more preferably 5 nm or greater from the viewpoint of satisfactorily maintaining the crystal structure. Further, the median diameter (D50) thereof is preferably 5 µm or less, more preferably 500 nm or less, and still more preferably 100 nm or less from the viewpoint of making the perovskite compound (1) difficult to be settled out.

According to another aspect of the present invention, the median diameter (D50) of the perovskite compound contained in the composition in the particle size distribution is preferably in a range of 3 nm to 5 µm, more preferably in a range of 4 nm to 500 nm, and still more preferably in a range of 5 nm to 100 nm.

In the present specification, the particle size distribution of the perovskite compound contained in the composition can be measured using, for example, a TEM or a SEM. Specifically, the median diameter (D50) thereof can be acquired by observing the maximum Feret diameter of twenty perovskite compounds contained in the composition using a TEM or a SEM and calculating the median diameter based on the distribution.

The perovskite compound contained in the composition of the present embodiment is a compound which includes constituent components A, B, and X and has a perovskite type crystal structure.

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is at least one anion selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

The perovskite compound having the constituent components A, B, and X is not particularly limited and may be a compound having any of a three-dimensional structure, a two-dimensional structure, and a quasi-two-dimensional structure.

In a case of the three-dimensional structure, the composition of the perovskite compound is represented by $ABX_{(3+\delta)}$.

In a case of the two-dimensional structure, the composition of the perovskite compound is represented by $A_2BX_{(4+\delta)}$.

Here, the parameter $\delta$ is a number which can be appropriately changed according to the charge balance of B and is in a range of $-0.7$ to $0.7$.

For example, in a case where A represents a monovalent cation, B represents a divalent cation, and X represents a monovalent cation, the parameter δ can be selected such that the compound becomes electrically neutral (in other words, the charge of the compound is 0).

In the case of the three-dimensional structure, the structure has a three-dimensional network of a vertex-sharing octahedron which has B as the center and X as a vertex and is represented by $BX_6$.

In the case of the two-dimensional structure, a structure in which a layer formed of two-dimensionally connected $BX_6$ and a layer formed of A are alternately laminated is formed in a case where the octahedron which has B as the center and X as a vertex and is represented by $BX_6$ shares Xs of four vertexes in the same plane.

B represents a metal cation which can have octahedral coordination of X.

In the present specification, the perovskite type crystal structure can be confirmed by an X-ray diffraction pattern.

In a case of the compound having the perovskite type crystal structure of the three-dimensional structure, typically, a peak derived from (hkl)=(001) is confirmed at a position where 2θ is in a range of 12° to 18° or a peak derived from (hkl)=(110) is confirmed at a position where 2θ is in a range of 18° to 25° in the X ray diffraction pattern.

It is more preferable that a peak derived from (hkl)=(001) is confirmed at a position where 2θ is in a range of 13° to 16° or a peak derived from (hkl)=(110) is confirmed at a position where 2θ is in a range of 20° to 23°.

In a case of the compound having the perovskite type crystal structure of the two-dimensional structure, typically, a peak derived from (hkl)=(002) is confirmed at a position where 2θ is in a range of 1° to 10° in the X ray diffraction pattern. It is more preferable that a peak derived from (hkl)=(002) is confirmed at a position where 2θ is in a range of 2° to 8°.

As the perovskite compound, a perovskite compound represented by Formula (1) is preferable.

$$ABX(3+\delta)(-0.7 \leq \delta \leq 0.7) \quad (1)$$

The constituent component A indicates a component positioned at each vertex of a hexahedron having the constituent component B at the center in a perovskite type crystal structure and is a monovalent cation.

The constituent component X indicates a component positioned at each vertex of an octahedron having the constituent component B at the center in the perovskite type crystal structure and is one or more kinds of anions selected from the group consisting of a halide ion and a thiocyanate ion.

The constituent component B indicates a component positioned at the centers of the hexahedron where the constituent component A is disposed at each vertex and the octahedron where the constituent component X is disposed at each vertex in the perovskite type crystal structure and is a metal ion.

[A]

In the perovskite compound, the constituent component A indicates a component positioned at each vertex of a hexahedron having the constituent component B at the center in a perovskite type crystal structure and is a monovalent cation, Examples of the monovalent cation include a cesium ion, an organic ammonium ion, and an amidinium ion. In a case where the constituent component A is a cesium ion, an organic ammonium ion having 3 or less carbon atoms, or an amidinium ion having 3 or less carbon atoms in the perovskite compound, the perovskite compound typically has a three-dimensional structure represented by $ABX_{(3+\delta)}$.

In the perovskite compound, a cesium ion or an organic ammonium ion is preferable as the constituent component A.

Specific examples of the organic ammonium ion as the constituent component A include a cation represented by Formula (A3).

(A3)

In Formula (A3), $R^6$ to $R^9$ each independently represent a hydrogen atom, an alkyl group which may contain an amino group as a substituent, or a cycloalkyl group which may contain an amino group as a substituent.

Here, not all of $R^6$ to $R^9$ simultaneously represent hydrogen atoms.

The alkyl group represented by each of independent $R^6$ to $R^9$ may be linear or branched and may have an amino group as a substituent.

In a case where $R^6$ to $R^9$ represent an alkyl group, the number of carbon atoms of each of independent $R^6$ to $R^9$ is typically in a range of 1 to 20, preferably in a range of 1 to 4, still more preferably in a range of 1 to 3, and even still more preferably 1.

The cycloalkyl group represented by each of independent $R^6$ to $R^9$ may contain an alkyl group or an amino group as a substituent.

The number of carbon atoms of the cycloalkyl group represented by each of independent $R^6$ to $R^9$ is typically in a range of 3 to 30, preferably in a range of 3 to 11, and more preferably in a range of 3 to 8. The number of carbon atoms include the number of carbon atoms in a substituent.

As the group represented by each of independent $R^6$ to $R^9$, a hydrogen atom or an alkyl group is preferable.

A compound having a perovskite type crystal structure of a three-dimensional structure with high emission intensity can be obtained by decreasing the number of alkyl groups and cycloalkyl groups which can be included in Formula (A3) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained.

In a case where a two-dimensional perovskite type crystal structure is laminated at infinity, the structure becomes the same as the three-dimensional perovskite type crystal structure (reference literature: for example, P. P. Boix et al., J. Phys. Chem. Lett. 2015, 6, 898 to 907).

It is preferable that the total number of carbon atoms in the alkyl group and the cycloalkyl group represented by $R^6$ to $R^9$ is in a range of 1 to 4 and more preferable that one of $R^6$ to $R^9$ represents an alkyl group having 1 to 3 carbon atoms and three of $R^6$ to $R^9$ represent a hydrogen atom.

Examples of the alkyl group as $R^6$ to $R^9$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

As the cycloalkyl group as $R^6$ to $R^9$, a group in which an alkyl group having 3 or more carbon atoms which has been provided as an exemplary example of the alkyl group represented by each of independent $R^6$ to $R^9$ forms a ring is an exemplary example, and examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

As the organic ammonium ion represented by A, $CH_3NH_3^+$ (also referred to as a methylammonium ion), $C_2H_5NH_3^+$ (also referred to as an ethylammonium ion), or $C_3H_7NH_2^+$ (also referred to as a propylammonium ion) is preferable, $CH_3NH_3^+$ or $C_2H_5NH_3^+$ is more preferable, $CH_3NH_3^+$ is still more preferable.

As the amidinium ion represented by A, an amidinium ion represented by Formula (A4) is an exemplary example.

$(R^{10}R^{11}N=CH-NR^{12}R^{13})^+$                       (A4)

In Formula (A4), $R^{10}$ to $R^{13}$ each independently represent a hydrogen atom, an alkyl group which may contain an amino group as a substituent, or a cycloalkyl group which may contain an amino group as a substituent.

The alkyl group represented by each of independent $R^{10}$ to $R^{13}$ may be linear or branched and may have an amino group as a substituent.

The number of carbon atoms in the alkyl group represented by each of independent $R^{10}$ to $R^{13}$ is typically in a range of 1 to 20, preferably in a range of 1 to 4, and still more preferably in a range of 1 to 3.

The cycloalkyl group represented by each of independent $R^{10}$ to $R^{13}$ may contain an alkyl group or an amino group as a substituent.

The number of carbon atoms of the cycloalkyl group represented by each of independent $R^{10}$ to $R^{13}$ is typically in a range of 3 to 30, preferably in a range of 3 to 11, and more preferably in a range of 3 to 8. The number of carbon atoms include the number of carbon atoms in a substituent.

Specific examples of the alkyl group as $R^{10}$ to $R^{13}$ are the same as those provided as exemplary examples of the alkyl group represented by each of independent $R^6$ to $R^9$.

Specific examples of the cycloalkyl group as $R^{10}$ to $R^{13}$ are the same as those provided as exemplary examples of the cycloalkyl group represented by each of independent $R^6$ to $R^9$.

As the group represented by each of independent $R^{10}$ to $R^{13}$, a hydrogen atom or an alkyl group is preferable.

A perovskite compound having a three-dimensional structure with high emission intensity can be obtained by decreasing the number of alkyl groups and cycloalkyl groups which can be included in Formula (A4) and decreasing the number of carbon atoms in the alkyl group and the cycloalkyl group.

In a case where the number of carbon atoms in the alkyl group or the cycloalkyl group is 4 or more, a compound partially or entirely having a two-dimensional and/or quasi-two-dimensional (quasi-2D) perovskite type crystal structure can be obtained. It is preferable that the total number of carbon atoms in the alkyl group and the cycloalkyl group represented by $R^{10}$ to $R^{13}$ is in a range of 1 to 4 and more preferable that $R^{10}$ represents an alkyl group having 1 to 3 carbon atoms and $R^{11}$ to $R^{13}$ represent a hydrogen atom.

[B]

In the perovskite compound, the constituent component B indicates a component positioned at the centers of the hexahedron where the constituent component A is disposed at each vertex and the octahedron where the constituent component X is disposed at each vertex in the perovskite type crystal structure and is a metal ion. The metal ion as the component B may be an ion formed of one or more selected from the group consisting of a monovalent metal ion, a divalent metal ion, and a trivalent metal ion. It is preferable that the component B contains a divalent metal ion and more preferable that the component B contains one or more metal ions selected from the group consisting of lead and tin.

[X]

In the perovskite compound, the constituent component X indicates a component positioned at each vertex of an octahedron having the constituent component B at the center in the perovskite type crystal structure and is at least one anion selected from the group consisting of a halide ion and a thiocyanate ion. The constituent component X may be at least one anion selected from the group consisting of a chloride ion, a bromide ion, a fluoride ion, an iodide ion, and a thiocyanate ion.

The constituent component X can be appropriately selected according to a desired emission wavelength. For example, the constituent component X may contain a bromide ion.

In a case where the constituent component X is two or more kinds of halide ions, the content ratio of the halide ions can be appropriately selected according to the emission wavelength. For example, a combination of a bromide ion and a chloride ion or a combination of a bromide ion and an iodide ion can be employed.

Specific preferred examples of the compound which is represented by $ABX_{(3+\delta)}$ and has the perovskite type crystal structure of the three-dimensional structure in the perovskite compound include $CH_3NH_3PbBr_3$, $CH_3NH_3PbCl_3$, $CH_3NH_3PbI_3$, $CH_3NH_3PbBr_{(3-y)}I_y$ (0<y<3), $CH_3NH_3PbBr_{(3-y)}Cl_y$ (0<y<3), $(H_2N=CH-NH_2)$ $PbBr_3$, $(H_2N=CH-NH_2)$ $PbCl_3$, $(H_2N=CH-NH_2)PbI_3$, $CH_3NH_3Pb_{(1-a)}Ca_aBr_3$ (0<a≤0.7), $CH_3NH_3Pb_{(1-a)}Sr_aBr_3$ (0<a≤0.7), $CH_3NH_3Pb_{(1-a)}La_aBr_{(3+\delta)}$ (0<a≤0.7, 0<δ≤0.7), $CH_3NH_3Pb_{(1-a)}Ba_aBr_3$ (0<a≤0.7), $CH_3NH_3Pb_{(1-a)}Dy_aBr_{(3+\delta)}$ (0<a≤0.7, 0<δ≤0.7), $CH_3NH_3Pb_{(1-a)}Na_aBr_{(3+\delta)}$ (0<a≤0.7, −0.7≤δ<0), $CH_3NH_3Pb_{(1-a)}Li_aBr_{(3+\delta)}$ (0<a≤0.7, −0.7≤δ<0), $CsPb_{(1-a)}Na_aBr_{(3+\delta)}$ (0<a≤0.7, −0.7≤δ<0), $CsPb_{(1-a)}Li_aBr_{(3+\delta)}$ (0<a≤0.7, −0.7≤δ<0), $CH_3NH_3Pb_{(1-a)}Na_aBr_{(3+\delta-y)}I_y$ (0<a≤0.7, −0.7≤δ<0, 0<y<3), $CH_3NH_3Pb_{(1-a)}Li_aBr_{(3+\delta-y)}I_y$ (0<a≤0.7, −0.7≤δ<0, 0<y<3), $CH_3NH_3Pb_{(1-a)}Na_aBr_{(3+\delta-y)}Cl_y$ (0<a≤0.7, −0.7≤δ<0, 0<y<3), $CH_3NH_3Pb_{(1-a)}Li_aBr_{(3+\delta-y)}$ (0<a≤0.7, −0.7≤δ<0, 0<y<3), $(H_2N=CH-NH_2)$ $Pb_{(1-a)}Na_aBr_{(3+\delta)}$ (0<a≤0.7, −0.7≤δ<0), $(H_2N=CH-NH_2)$ $Pb_{(1-a)}Li_aBr_{(3+\delta)}$ (0<a≤0.7, −0.7≤δ<0), $(H_2N=CH-NH_2)$ $Pb_{(1-a)}Na_aBr_{(3+\delta-y)}I_y$ (0<a≤0.7, −0.7≤δ<0, 0<y<3), $(H_2N=CH-NH_2)$ $Pb_{(1-a)}Na_aBr_{(3+\delta-y)}Cl_y$ (0<a≤0.7, −0.7≤δ<0, 0<y<3), $CsPbBr_3$, $CsPbCl_3$, $CsPbI_3$, $CsPbBr_{(3-y)}I_y$ (0<y<3), $CsPbBr_{(3-y)}Cl_y$ (0<y<3), $CH_3NH_3PbBr_{(3-y)}Cl_y$ (0<y<3), $CH_3NH_3Pb_{(1-a)}Zn_aBr_3$ (0<a≤0.7), $CH_3NH_3Pb_{(1-a)}Al_aBr_{(3+\delta)}$ (0<a≤0.7, 0≤δ≤0.7), $CH_3NH_3Pb_{(1-a)}Co_aBr_3$ (0<a≤0.7), $CH_3NH_3$ $Pb_{(1-a)}Mn_aBr_3$ (0<a≤0.7), $CH_3NH_3Pb_{(1-a)}Mg_aBr_3$ (0<a≤0.7), $CsPb_{(1-a)}Zn_aBr_3$ (0<a≤0.7), $CsPb_{(1-a)}Al_aBr_{(3+\delta)}$ (0<a≤0.7, 0<δ≤0.7), $CsPb_{(1-a)}Co_aBr_3$ (0<a≤0.7), $CsPb_{(1-a)}Mn_aBr_3$ (0<a≤0.7), $CsPb_{(1-a)}Mg_aBr_3$ (0<a≤0.7), $CH_3NH_3Pb_{(1-a)}Zn_aBr_{(3-y)}I_y$ (0<a≤0.7, 0<y<3), $CH_3NH_3Pb_{(1-a)}Al_aBr_{(3+\delta-y)}I_y$ (0<a≤0.7, 0<δ≤0.7, 0<y<3), $CH_3NH_3Pb_{(1-a)}Co_aBr_{(3-y)}I_y$ (0<a≤0.7, 0<y<3), $CH_3NH_3Pb_{(1-a)}Mn_aBr_{(3-y)}I_y$ (0<a≤0.7, 0<y<3), $CH_3NH_3Pb_{(1-a)}Mg_aBr_{(3-y)}I_y$ (0<a≤0.7, 0<y<3), $CH_3NH_3Pb_{(1-a)}Zn_aBr_{(3-y)}Cl_y$ (0<a≤0.7, 0<y<3), $CH_3NH_3Pb_{(1-a)}Al_aBr_{(3+\delta-y)}Cl_y$ (0<a≤0.7, 0<δ≤0.7, 0<y<3), $CH_3NH_3Pb_{(1-a)}Co_aBr_{(3+\delta-y)}Cl_y$ (0<a≤0.7, 0<y<3), $CH_3NH_3Pb_{(1-a)}Mn_aBr_{(3-y)}Cl_y$ (0<a≤0.7, 0<y<3), $CH_3NH_3Pb_{(1-a)}Mg_aBr_{(3-y)}Cl_y$ (0<a≤0.7, 0<y<3), $(H_2N=CH-NH_2) Zn_aBr_3$ (0<a≤0.7), $(H_2N=CH-NH_2) Mg_aBr_3$ (0<a≤0.7), $(H_2N=CH-NH_2) Pb_{(1-a)}Zn_aBr_{(3-y)}$ (0<a≤0.7, 0<y<3), and $(H_2N=CH-NH_2) Pb_{(1-a)}Zn_aBr_{(3-y)}Cl_y$ (0<a≤0, 0<y<3).

According to one aspect of the present invention, as the perovskite compound which is a compound represented by $ABX_{(3+\delta)}$ and having the perovskite type crystal structure of the three-dimensional structure, $CsPbBr_3$ or $CsPbBr_{(3-y)}I_y$ (0<y<3) is preferable.

Specific preferred examples of the compound which is represented by $A_2BX_{(4+\delta)}$ and has the perovskite type crystal structure of the two-dimensional structure in the perovskite compound include $(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}$ (0<a≤0.7, −0.7≤δ<0), $(C_4H_9NH_3)_2Pb_{(1-a)}Na_aBr_{(4+\delta)}$ (0<a≤0.7, −0.7≤δ<0), $(C_4H_9NH_3)_2Pb_{(1-a)}Rb_aBr(4+\delta)$ (0<a≤0.7, −0.7≤δ<0), $(C_7H_{15}NH_3)_2Pb_{(1-a)}Na_aBr_{(4+\delta)}$ (0<a≤0.7, −0.7≤δ<0), $(C_7H_{15}NH_3)_2Pb_{(1-a)}Li_aBr_{(4+\delta)}$ (0<a≤0.7, −0.7≤δ<0), $(C_7H_{15}NH_3)_2Pb_{(1-a)}Rb_aBr_{(4+\delta)}$ (0<a≤0.7, −0.7≤δ<0), $(C_4H_9NH_3)_2Pb_{(1-a)}Na_aBr_{(4+\delta-y)}I_y$ (0<a≤0.7, −0.7≤δ<0, 0<y<4), $(C_4H_9NH_3)_2Pb_{(1-a)}Li_aBr_{(4+\delta-y)}I_y$ (0<a≤0.7, −0.7≤δ<0, 0<y<4), $(C_4H_9NH_3)_2Pb_{(1-a)}Rb_aBr_{(4+\delta-y)}I_y$ (0<a≤0.7, −0.7≤δ<0, 0<y<4), $(C_4H_9NH_3)_2Pb_{(1-a)}Na_aBr_{(4+\delta-y)}Cl_y$ (0<a≤0.7, −0.7≤δ<0, 0<y<4), $(C_4H_9NH_3)_2Pb_{(1-a)}Li_aBr_{(4+\delta-y)}Cl_y$ (0<a≤0.7, −0.7≤δ<0, 0<y<4), $(C_4H_9NH_3)_2Pb_{(1-a)}Rb_aBr_{(4+\delta-y)}Cl_y$ (0<a≤0.7, −0.7≤δ<0, 0<y<4), $(C_4H_9NH_3)_2PbBr_4$, $(C_7H_{15}NH_3)_2PbBr_4$, $(C_4H_9NH_3)_2PbBr_{(4-y)}Cl_y$ (0<y<4), $(C_4H_9NH_3)_2PbBr_{(4-y)}I_y$ (0<y<4), $(C_4H_9NH_3)_2Pb_{(1-a)}Zn_aBr_4$ (0<a≤0.7), $(C_4H_9NH_3)_2Pb_{(1-a)}Mg_aBr_4$ (0<a≤0.7), $(C_4H_9NH_3)_2Pb_{(1-a)}Co_aBr_4$ (0<a≤0.7), $(C_4H_9NH_3)_2Pb_{(1-a)}Mn_aBr_4$ (0<a≤0.7), $(C_7H_{15}NH_3)_2Pb_{(1-a)}Zn_aBr_4$ (0<a≤0.7), $(C_7H_{15}NH_3)_2Pb_{(1-a)}Mg_aBr_4$ (0<a≤0.7), $(C_7H_{15}NH_3)_2Pb_{(1-a)}Co_aBr_4$ (0<a≤0.7), $(C_7H_{15}NH_3)_2Pb_{(1-a)}Mn_aBr_4$ (0<a≤0.7), $(C_4H_9NH_3)_2Pb_{(1-a)}Zn_aBr_{(4-y)}I_y$ (0<a≤0.7, 0<y<4), $(C_4H_9NH_3)_2Pb_{(1-a)}Mg_aBr_{(4-y)}I_y$ (0<a≤0.7, 0<y<4), $(C_4H_9NH_3)_2Pb_{(1-a)}Co_aBr_{(4-y)}I_y$ (0<a≤0.7, 0<y<4), $(C_4H_9NH_3)_2Pb_{(1-a)}Mn_aBr_{(4-y)}I_y$ (0<a≤0.7, 0<y<4), $(C_4H_9NH_3)_2Pb_{(1-a)}Zn_aBr_{(4-y)}Cl_y$ (0<a≤0.7, 0<y<4), $(C_4H_9NH_3)_2Pb_{(1-a)}Mg_aBr_{(4-y)}Cl_y$ (0<a≤0.7, 0<y<4), $(C_4H_9NH_3)_2Pb_{(1-a)}Co_aBr_{(4-y)}Cl_y$ (0<a≤0.7, 0<y<4), and $(C_4H_9NH_3)_2Pb_{(1-a)}Mn_aBr_{(4-y)}Cl_y$ (0<a≤0.7, 0<y<4).

<<Emission Spectrum>>

The perovskite compound is a light emitting material which is capable of emitting fluorescence in a visible light wavelength range. In a case where the constituent component X is a bromide ion, the compound is capable of emitting fluorescence having a maximum peak of the intensity in a wavelength range of typically 480 nm or greater, preferably 500 nm or greater, and more preferably 520 nm or greater and typically 700 nm or less, preferably 600 nm or less, and more preferably 580 nm or less.

The above-described upper limit and lower limit can be combined as desired.

According to another aspect of the present invention, in the case where the constituent component X in the perovskite compound is a bromide ion, the peak of the emitted fluorescence is typically in a range of 480 nm to 700 nm, preferably in a range of 500 nm to 600 nm, and more preferably in a range of 520 nm to 580 nm.

In a case where the constituent component X is an iodide ion, the compound is capable of emitting fluorescence having a maximum peak of the intensity in a wavelength range of typically 520 nm or greater, preferably 530 nm or greater, and more preferably 540 nm or greater and typically 800 nm or less, preferably 750 nm or less, and more preferably 730 nm or less.

The above-described upper limit and lower limit can be combined as desired.

According to another aspect of the present invention, in the case where the constituent component X in the perovskite compound is an iodide ion, the peak of the emitted fluorescence is typically in a range of 520 nm to 800 nm, preferably in a range of 530 nm to 750 nm, and more preferably in a range of 540 nm to 730 nm.

In a case where the constituent component X is a chloride ion, the compound is capable of emitting fluorescence having a maximum peak of the intensity in a wavelength range of typically 300 nm or greater, preferably 310 nm or greater, and more preferably 330 nm or greater and typically 600 nm or less, preferably 580 nm or less, and more preferably 550 nm or less.

The above-described upper limit and lower limit can be combined as desired.

According to another aspect of the present invention, in the case where the constituent component X in the perovskite compound is a chloride ion, the peak of the emitted fluorescence is typically in a range of 300 nm to 600 nm, preferably in a range of 310 nm to 580 nm, and more preferably in a range of 330 nm to 550 nm.

Silazane or Modified Product Thereof (2)

A silazane is a compound having a Si—N—Si bond. The silazane may be linear, branched, or cyclic. Further, the silazane may be low molecular or high molecular (in the present specification, also referred to as a polysilazane).

The "low-molecular-weight" in the present specification indicates that the number average molecular weight is less than 600, and the "high-molecular-weight" indicates that the number average molecular weight is in a range of 600 to 2000.

In the present specification, the "number average molecular weight" indicates a value in terms of polystyrene to be measured according to a gel permeation chromatography (GPC) method.

For example, a low-molecular-weight silazane represented by Formula (B1) or (B2) or a polysilazane which has a constituent unit represented by Formula (B3) or has a structure represented by Formula (B4) is preferable.

The silazane may be used by performing silica modification according to the following method.

The silazane contained in the composition according to the present embodiment may be a modified product of a silazane which has been modified according to the following method.

The modification indicates that a Si—O—Si bond is formed by substituting N with O in at least some Si—N—Si bonds contained in the silazane, and the modified product of the silazane indicates a compound having a Si—O—Si bond.

As the modified product of the silazane, a low-molecular-weight compound in which at least one N in Formula (B1) or (B2) is substituted with O, a high-molecular-weight compound in which at least one N in a polysilazane having a constituent unit represented by Formula (B3) is substituted with O, or a high-molecular-weight compound in which at least one N in a polysilazane having a structure represented by Formula (B4) is substituted with O is preferable.

The ratio of the number of substituted Os is preferably in a range of 0.1% to 100%, more preferably in a range of 10% to 98%, and still more preferably in a range of 30% to 95% with respect to the total amount of N in Formula (B2).

The ratio of the number of substituted Os is preferably in a range of 0.1% to 100%, more preferably in a range of 10% to 98%, and still more preferably in a range of 30% to 95% with respect to the total amount of N in Formula (B3).

The ratio of the number of substituted Os is preferably in a range of 0.1% to 99%, more preferably in a range of 10% to 97%, and still more preferably in a range of 30% to 95% with respect to the total amount of N in Formula (B4).

The modified product of a silazane may be used alone or in the form of a mixture of two or more kinds thereof.

The number of Si atoms, the number of N atoms, and the number of O atoms contained in the silazane or modified product thereof can be calculated according to nuclear magnetic resonance spectroscopy (NMR), X-ray photoelectron spectroscopy (XPS), or energy dispersive X-ray analysis (EDX) using a transmission electron microscope (TEM).

According to a particularly preferable method, the calculation can be made by measuring the number of Si atoms, the number of N atoms, and the number of O atoms in the composition according to the X-ray photoelectron spectroscopy (XPS).

The ratio of the number of O atoms to the number of N atoms contained in the silazane and modified product thereof to be measured according to the above-described method is preferably in a range of 0.1% to 99%, more preferably in a range of 10% to 95%, and still more preferably 30% to 90%.

At least a part of the silazane or modified product thereof may be adsorbed by the perovskite compound contained in the composition or may be dispersed in the composition.

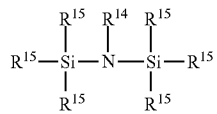

(B1)

In Formula (B1), $R^{14}$ and $R^{15}$ each independently represent a hydrogen atom, an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms. The alkyl group having 1 to 20 carbon atoms, the alkenyl group having 1 to 20 carbon atoms, the cycloalkyl group having 3 to 20 carbon atoms, the aryl group having 6 to 20 carbon atoms, or the alkylsilyl group having 1 to 20 carbon atoms may have a substituent such as an amino group. A plurality of $R^{15}$'s may be the same as or different from one another.

Examples of the low-molecular-weight silazane represented by Formula (B1) include 1,3-divinyl-1,1,3,3-tetramethyldisilazane, 1,3-diphenyltetramethyldisilazane, and 1,1,1,3,3,3-hexamethyldisilazane.

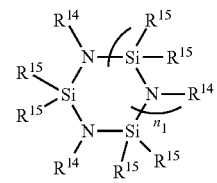

(B2)

In Formula (B2), $R^{14}$ and $R^{15}$ each have the same definition as described above.

A plurality of $R^{14}$'s may be the same as or different from one another.

A plurality of $R^{15}$'s may be the same as or different from one another.

$n_1$ represents an integer of 1 to 20. $n_1$ may represent an integer of 1 to 10 or 1 or 2.

Examples of the low-molecular-weight silazane represented by Formula (B2) include octamethylcyclotetrasilazane, 2,2,4,4,6,6,-hexamethylcyclotrisilazane, and 2,4,6-trimethyl-2,4,6-trivinylcyclotrisilazane.

As the low-molecular-weight silazane, octamethylcyclotetrasilazane or 1,3-diphenyltetramethyldisilazane is preferable, and octamethylcyclotetrasilazane is more preferable.

The polysilazane is a polymer compound having a Si—N—Si bond and is not particularly limited, and examples thereof include a polymer compound having a constituent unit represented by Formula (B3).

The constituent unit represented by Formula (B3) which is contained in the polysilazane may be used alone or in combination of a plurality of kinds thereof.

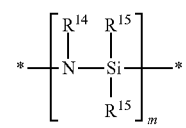

(B3)

In Formula (B3), $R^{14}$ and $R^{15}$ each have the same definition as described above.

The symbol "*" represents a bonding site. The bonding site of the N atom at the terminal may have the same substituent as that of $R^{14}$, and the bonding site of the Si atom at the terminal may have the same substituent as that of R'5.

A plurality of $R^{14}$'s may be the same as or different from one another.

A plurality of $R^{15}$'s may be the same as or different from one another.

m represents an integer of 2 to 10000.

The polysilazane having a constituent unit represented by Formula (B3) may be a perhydropolysilazane in which all of $R^{14}$'s and $R^{15}$'s represent a hydrogen atom.

The polysilazane having a constituent unit represented by Formula (B3) may be an organopolysilazane in which at least one $R^{15}$ represents a group other than the hydrogen atom.

According to the application thereof, the perhydropolysilazane or organopolysilazane may be appropriately selected or can be used by being mixed.

The polysilazane may have a ring structure in a portion of a molecule. For example, the polysilazane may have a structure represented by Formula (B4).

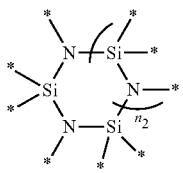

(B4)

In Formula (B4), the symbol "*" represents a bonding site.

The bonding site may be bonded to the bonding site of the constituent unit represented by Formula (B3).

In a case where the polysilazane has a plurality of structures represented by Formula (B4) in a molecule, a bonding site of the structure represented by Formula (B4) may be bonded to another bonding site of the structure represented by Formula (B4).

The bonding site of the constituent unit represented by Formula (B3) or the bonding site of the N atom which is not bonded to another bonding site of the structure represented by Formula (B4) may have the same substituent as that of $R^{14}$, and the bonding site of the constituent unit represented by Formula (B3) or the bonding site of the Si atom which is not bonded to another bonding site of the structure represented by Formula (B4) may have the same substituent as that of $R^{15}$.

$n_2$ represents an integer of 1 to 10000. $n_2$ may represent an integer of 1 to 10 or 1 or 2.

The silazane or modified product thereof (2) is not particularly limited. However, from the viewpoints of improving the dispersibility and suppressing aggregation, an organopolysilazane or modified product thereof is preferable. The organopolysilazane may be an organopolysilazane in which at least one of $R^{14}$ and $R^{15}$ in Formula (B3) represents an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms and which has a constituent unit represented by Formula (B3), or an organopolysilazane in which at least one bonding site in Formula (B4) is bonded to $R^{14}$ or $R^{15}$ and at least one of $R^{14}$ and $R^{15}$ represents an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms and which has a structure represented by Formula (B4).

It is preferable that the organopolysilazane is an organopolysilazane in which at least one of $R^{14}$ and $R^{15}$ in Formula (B3) represents a methyl group and has a constituent unit represented by Formula (B3), or a polysilazane in which at least one bonding site in Formula (B4) is bonded to $R^{14}$ or $R^{15}$ and at least one of $R^{14}$ and $R^{15}$ represents a methyl group and which has a structure represented by Formula (B4).

A typical polysilazane is a structure in which a linear structure and a ring structure such as a 6-membered ring or a 8-membered ring are present. The molecular weight thereof is approximately 600 to 2000 (in terms of polystyrene) as the number average molecular weight (Mn), and the silazane may be a substance in a liquid or solid state depending on the molecular weight thereof. As the polysilazane, a commercially available product may be used, and examples of the commercially available product include NN120-10, NN120-20, NAX120-20, NN110, NAX120, NAX110, NL120A, NL110A, NL150A, NP110, and NP140 (all manufactured by AZ Electronic Materials plc), AZNN-120-20, Durazane (registered trademark) 1500 Slow Cure, Durazane (registered trademark) 1500 Rapid Cure, and Durazane (registered trademark) 1800 (all manufactured by Merck Performance Materials Ltd.), and Durazane (registered trademark) 1033 (manufactured by Merck Performance Materials Ltd.).

As the polysilazane having a constituent unit represented by Formula (B3), AZNN-120-20, Durazane (registered trademark) 1500 Slow Cure or Durazane (registered trademark) 1500 Rapid cure is preferable, and Durazane (registered trademark) 1500 Slow Cure is more preferable.

(3) Solvent

The solvent is not particularly limited as long as the solvent is a medium in which the compound (1) can be dispersed. Further, a solvent in which the compound (1) is unlikely to be dissolved is preferable.

In the present specification, the "solvent" indicates a substance (excluding a polymerizable compound and a polymer) that enters a liquid state at 25° C. and 1 atm.

In the present specification, the term "dispersed" indicates a state in which the compound (1) is floated or suspended in a solvent, a polymerizable compound, or a polymer or may be partially precipitated.

Examples of the solvent include an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

Among these, an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxyacetonitrile; an organic solvent containing a carbonate group such as ethylene carbonate or propylene carbonate; an organic solvent containing a halogenated hydrocarbon group such as methylene chloride or chloroform; or an organic solvent containing a hydrocarbon group such as n-pentane, cyclohexane, n-hexane, benzene, toluene, or xylene is preferable from the viewpoint that the polarity is low and the compound (1) is unlikely to be dissolved therein, and an organic solvent containing a halogenated hydrocarbon group such as methylene chloride or chloroform; or an organic solvent containing a hydrocarbon group such as n-pentane, cyclohexane, n-hexane, benzene, toluene, or xylene is more preferable.

Polymerizable Compound or Polymer (4)

The polymerizable compound contained in the composition according to the present embodiment is not particularly limited, and one or two or more kinds thereof may be used. As the polymerizable compound, a polymerizable compound with a low solubility of the compound (1) at the temperature at which the composition according to the present embodiment is produced is preferable.

In the present specification, the "polymerizable compound" indicates a compound of a monomer containing a polymerizable group.

For example, in a case where the composition is produced at room temperature under normal pressure, the polymerizable compound is not particularly limited, and examples thereof include known polymerizable compounds such as styrene, acrylic acid ester, methacrylic acid ester, and acrylonitrile. Among these, acrylic acid ester and/or methacrylic acid ester serving as a monomer component of an acrylic resin is preferable as the polymerizable compound.

The polymer contained in the composition according to the present embodiment is not particularly limited, and one or two or more kinds thereof may be used. As the polymer, a polymer with a low solubility of the compound (1) at the temperature at which the composition according to the present embodiment is produced is preferable.

For example, in a case where the composition is produced at room temperature under normal pressure, the polymer is not particularly limited, and examples thereof include known polymers such as polystyrene, an acrylic resin, and an epoxy resin. Among these, an acrylic resin is preferable as the polymer. The acrylic resin has a constitutional unit derived from acrylic acid ester and methacrylic acid ester.

In the composition according to the present embodiment, the amount of the acrylic acid ester and/or methacrylic acid ester and the constitutional unit derived from these may be 10% by mole or greater, 30% by mole or greater, 50% by mole or greater, 80% by mole or greater, or 100% by mole with respect to the amount of all constitutional units contained in the polymerizable compound or polymer (4).

The weight-average molecular weight of the polymer is preferably in a range of 100 to 1200000, more preferably in a range of 1000 to 800000, and still more preferably in a range of 5000 to 150000.

In the present specification, the "weight-average molecular weight" indicates a value in terms of polystyrene to be measured according to a gel permeation chromatography (GPC) method.

At least one compound or ion (5) selected from group consisting of ammonia, amine, and carboxylic acid, and salts or ions thereof.

Along with the ammonia, the amine, and the carboxylic acid, the composition according to the present embodiment may contain at least one compound or ion selected from the group consisting of salts and ions thereof as the form which can be employed by these compounds.

In other words, the composition according to the present embodiment may contain at least one compound or ion selected from the group consisting of ammonia, an amine, a carboxylic acid, a salt of the ammonia, a salt of the amine, a salt of the carboxylic acid, an ion of the ammonia, an ion of the amine, and an ion of the carboxylic acid.

The ammonia, the amine, the carboxylic acid, and the salts and the ions thereof typically function as capping ligands. The capping ligand is a compound having a function of being adsorbed on the surface of the compound (1) and stably dispersing the compound (1) in the composition.

Examples of the ions or salts (such as an ammonium salt) of the ammonia or amine include an ammonium cation represented by Formula (A1) and an ammonium salt containing the ammonium cation. Examples of the ions or salts (such as a carboxylate) of the carboxylic acid include a carboxylate anion represented by Formula (A2) and a carboxylate containing the carboxylate anion. The composition according to the present embodiment may contain any one or both of an ammonium salt and a carboxylate. The compound or ion (5) may be an ammonium cation represented by Formula (A1) or an ammonium salt containing the ammonium cation.

(A1)

In Formula (A1), $R^1$ to $R^3$ represent a hydrogen atom, and $R^4$ represents a hydrogen atom or a monovalent hydrocarbon group. The hydrocarbon group represented by $R^4$ may be a saturated hydrocarbon group (in other words, an alkyl group or a cycloalkyl group) or an unsaturated hydrocarbon group.

The alkyl group represented by $R^4$ may be linear or branched.

The number of carbon atoms of the alkyl group represented by $R^4$ is typically in a range of 1 to 20, preferably in a range of 5 to 20, and more preferably in a range of 8 to 20.

The cycloalkyl group represented by $R^4$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^4$ may be linear or branched.

The number of carbon atoms in the unsaturated hydrocarbon group as $R^4$ is typically in a range of 2 to 20, preferably in a range of 5 to 20, and more preferably in a range of 8 to 20.

It is preferable that $R^4$ represents a hydrogen atom, an alkyl group, or an unsaturated hydrocarbon group. As the unsaturated hydrocarbon group, an alkenyl group is preferable. It is preferable that $R^4$ represents an alkenyl group having 8 to 20 carbon atoms.

Specific examples of the alkyl group as $R^4$ include those provided as exemplary examples of the alkyl group represented by $R^6$ to $R^9$.

Specific examples of the cycloalkyl group as $R^4$ include those provided as exemplary examples of the cycloalkyl group represented by $R^6$ to $R^9$.

As the alkenyl group represented by $R^4$, a group in which any one single bond (C—C) between carbon atoms is substituted with a double bond (C=C) in the linear or branched alkyl group as $R^6$ to $R^9$ is an exemplary example, and the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

In a case of the ammonium cation forms a salt, the counter ion is not particularly limited, and preferred examples thereof include halide ions such as Br—, Cl—, I—, and F—; and carboxylate ions.

Preferred examples of the ammonium cation represented by Formula (A1) and the ammonium salt containing a counter anion include an n-octylammonium salt and an oleyl ammonium salt.

The compound or ion (5) may be a carboxylate anion represented by Formula (A2) or a carboxylate containing the carboxylate anion.

$$R^5-CO_2^- \qquad (A2)$$

In Formula (A2), $R^5$ represents a monovalent hydrocarbon group. The hydrocarbon group represented by $R^5$ may be a saturated hydrocarbon group (in other words, an alkyl group or a cycloalkyl group) or an unsaturated hydrocarbon group.

The alkyl group represented by $R^5$ may be linear or branched. The number of carbon atoms of the alkyl group represented by $R^5$ is typically in a range of 1 to 20, preferably in a range of 5 to 20, and more preferably in a range of 8 to 20.

The cycloalkyl group represented by $R^5$ may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^5$ may be linear or branched. The number of carbon atoms in the unsaturated hydrocarbon group as $R^5$ is typically in a range of 2 to 20, preferably in a range of 5 to 20, and more preferably in a range of 8 to 20.

It is preferable that $R^5$ represents an alkyl group or an unsaturated hydrocarbon group. As the unsaturated hydrocarbon group, an alkenyl group is preferable.

Specific examples of the alkyl group as $R^5$ include those provided as exemplary examples of the alkyl group represented by $R^6$ to $R^9$.

Specific examples of the cycloalkyl group as $R^5$ include those provided as exemplary examples of the cycloalkyl group represented by $R^6$ to $R^9$.

Specific examples of the alkenyl group as $R^5$ include those provided as exemplary examples of the alkenyl group represented by $R^4$.

As the carboxylate anion represented by Formula (A2), an oleate anion is preferable.

In a case where the carboxylate anion forms a salt, the counter cation is not particularly limited, and preferred examples thereof include an alkali metal ion, an alkaline earth metal cation, and an ammonium cation.

<Regarding Compounding Ratio of Each Component>

The compounding ratio between the compound (1) and the silazane or modified product thereof (2) in the composition according to the present embodiment may be at the level where the effect of improvement in the durability with respect to water vapor due to the silazane or modified product thereof (2) is exhibited and can be appropriately determined depending on the kind and the like of the compound (1) and the silazane or modified product thereof (2).

In the composition according to the present embodiment, the molar ratio [Si/B] of the Si element in the silazane or modified product thereof (2) to the metal ion serving as the component B in the compound (1) may be in a range of 0.001 to 2000 or in a range of 0.01 to 500.

In the composition according to the present embodiment, in a case where the silazane or modified product thereof (2) is a silazane represented by Formula (B1) or (B2) or a modified product thereof, the molar ratio [Si/B] of Si in the silazane or modified product thereof (2) to the metal ion serving as the component B in the compound (1) may be in a range of 1 to 1000, in a range of 10 to 500, or in a range of 20 to 300.

In the composition according to the present embodiment, in a case where the silazane or modified product thereof (2) is a polysilazane having a constituent unit represented by Formula (B3), the molar ratio [Si/B] of the Si element in the silazane or modified product thereof (2) to the metal ion serving as the component B in the compound (1) may be in a range of 0.001 to 2000, in a range of 0.01 to 2000, in a range of 0.1 to 1000, in a range of 1 to 500, or in a range of 2 to 300.

From the viewpoint that the effect of improvement in the durability with respect to water vapor due to the silazane or modified product thereof (2) is particularly satisfactorily exhibited, a composition in which the compounding ratio between the compound (1) and the silazane or modified product thereof (2) is in the above-described range is preferable.

The compounding ratio between the mass of the compound (1), and the total mass of the solvent (3) and the polymerizable compound or polymer (4) in the composition according to the present embodiment may be at the level where the effect of light emission due to the compound (1) is satisfactorily exhibited and can be appropriately determined depending on the kind and the like of the compound (1), the silazane or modified product thereof (2), the solvent (3), and the polymerizable compound or polymer (4).

In the composition according to the embodiment which contains the compound (1), the silazane or modified product thereof (2), and at least one selected from the group consisting of the solvent (3), and the polymerizable compound or polymer (4), the mass ratio [(1)/(total of (3) and (4))] of the mass of the compound (1) to the total mass of the solvent (3) and the polymerizable compound or polymer (4) may be in a range of 0.00001 to 10, in a range of 0.0001 to 2, or in a range of 0.0005 to 1.

From the viewpoints of making the compound (1) difficult to aggregate and satisfactorily exhibiting the light-emitting property, a composition in which the compounding ratio between the mass of the compound (1), and the total mass of the solvent (3) and the polymerizable compound or polymer (4) is in the above-described range is preferable.

The compounding ratio between the compound (1) and the polymer (4') in the composition according to the present embodiment may be at the level where the effect of light emission due to the compound (1) is satisfactorily exhibited and can be appropriately determined depending on the kind and the like of the compound (1), the silazane or modified product thereof (2), and the polymer (4').

In the composition according to the embodiment which contains the compound (1), the silazane or modified product thereof (2), and the polymer (4') and in which the total content ratio of the compound (1), the silazane or modified product thereof (2), and the polymer (4') is 90% by mass or greater with respect to the total mass of the composition, the mass ratio [(1)/(4')] of the compound (1) to the polymer (4') may be in a range of 0.00001 to 10, in a range of 0.0001 to 2, or in a range of 0.0005 to 1.

From the viewpoints of making the compound (1) difficult to aggregate and satisfactorily exhibiting the light-emitting property, a composition in which the compounding ratio between the compound (1) and the polymer (4') is in the above-described range is preferable.

The compounding ratio between the compound (1) and the compound or ion (5) in the composition according to the present embodiment may be at the level where the effect of light emission due to the compound (1) is satisfactorily exhibited and can be appropriately determined depending on the kind and the like of the compound (1), the silazane or modified product thereof (2), the solvent (3), the polymerizable compound or polymer (4), and the compound or ion (5).

In the composition according to the embodiment which contains the compound (1), the silazane or modified product thereof (2), the compound or ion (5), and at least one selected from the group consisting of the solvent (3), and the polymerizable compound or polymer (4), the molar ratio [(1)/(5)] of the compound (1) to the compound or ion (5) may be in a range of 0.00001 to 1000 or in a range of 0.01 to 100.

From the viewpoints of making the compound (1) difficult to aggregate and satisfactorily exhibiting the light-emitting property, a composition in which the compounding ratio between the compound (1) and the compound or ion (5) is in the above-described range is preferable.

In the composition according to the embodiment which contains the compound (1), the silazane or modified product thereof (2), the compound or ion (5), and the polymer (4') and in which the total content ratio of the compound (1), the silazane or modified product thereof (2), and the polymer (4') is 90% by mass or greater with respect to the total mass of the composition, the molar ratio [(1)/(5)] of the compound (1) to the compound or ion (5) may be in a range of 0.00001 to 10, in a range of 0.0001 to 2, or in a range of 0.0005 to 1.

From the viewpoints of making the compound (1) difficult to aggregate and satisfactorily exhibiting the light-emitting property, a composition in which the compounding ratio between the compound (1) and the compound or ion (5) is in the above-described range is preferable.

<Method for Producing Composition>

Hereinafter, a method for producing the composition of the present invention will be described based on the embodiments.

According to the production method, the composition according to the present invention can be produced. Further, the composition of the present invention is not limited to a composition produced by a method for producing a composition according to the embodiment described below.

Method for producing perovskite compound (1) having constituent components A, B, and X The perovskite compound according to the present invention can be produced according to a method of a first embodiment or a second embodiment described below with reference to the known literature (Nano Lett. 2015, 15, 3692 to 3696, ACSNano, 2015, 9, 4533 to 4542).

(First Embodiment of Method for Producing Perovskite Compound Containing Constituent Components A, B, and X)

Examples of the method for producing the perovskite compound according to the present invention include a production method including a step of dissolving the component B, the component X, and the component A in a solvent x; and a step of mixing the obtained solution g with a solvent y in which the solubility of the perovskite compound therein is lower than that of the solvent x used in the step of obtaining the solution g.

More specific examples thereof include a production method including a step of dissolving a compound that contains the component B and the component X and a compound that contains the component A, or the component A and the component X in a solvent x to obtain a solution g; and a step of mixing the obtained solution g with a solvent y in which the solubility of the perovskite compound therein is lower than that of the solvent x used in the step of obtaining the solution g.

The perovskite compound is precipitated by mixing the obtained solution g with the solvent y in which the solubility of the perovskite compound therein is lower than that of the solvent x used in the step of obtaining the solution g.

Hereinafter, the production method including a step of dissolving a compound that contains the component B and the component X and a compound that contains the component A, or the component A and the component X in a solvent x to obtain a solution g; and a step of mixing the obtained solution g with a solvent y in which the solubility of the perovskite compound therein is lower than that of the solvent x used in the step of obtaining the solution g will be described.

Further, the solubility indicates the solubility at the temperature of carrying out the mixing step.

From the viewpoint of stably dispersing the perovskite compound, it is preferable that the production method includes a step of adding capping ligands.

It is preferable that the capping ligands are added before the mixing step is carried out. The capping ligands may be added to the solution g in which the component A, the component B, and the component X are dissolved; the solvent y in which the solubility of the perovskite compound therein is lower than that of the solvent x used in the step of obtaining the solution g; or both of solvent x and the solvent y. It is preferable that the production method includes a step of removing coarse particles using a method of carrying out centrifugation or filtration after the mixing step described above.

The size of the coarse particles to be removed by the removal step is preferably 10 µm or greater, more preferably 1 µm or greater, and still more preferably 500 nm or greater.

The step of mixing the solution g with the solvent y described above may be a step (I) of adding the solution g dropwise to the solvent y or a step (II) of adding the solvent y dropwise to the solution g.

However, from the viewpoint of improving the dispersibility of the compound (1), the step (I) is preferable.

It is preferable that stirring is performed during dropwise addition from the viewpoint of improving the dispersibility of the compound (1). In the step of mixing the solution g with the solvent y, the temperature is not particularly limited, but is preferably in a range of −20° C. to 40° C. and more preferably in a range of −5° C. to 30° C. from the viewpoint of ensuring easy precipitation of the perovskite compound (1).

Two kinds of solvents x and y with different solubilities in the solvent of the perovskite compound used in the production method are not particularly limited, and examples thereof include two solvents selected from the group consisting of alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

As the solvent x used in the step of obtaining the solution g which is included in the production method, a solvent with a higher solubility in the solvent of the perovskite compound is preferable, and examples thereof include, in a case where the step is performed at room temperature (10° C. to 30° C.), alcohols such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; and dimethyl sulfoxide.

As the solvent y used in the mixing step which is included in the production method, a solvent with a lower solubility in the solvent of the perovskite compound is preferable, and examples thereof include, in a case where the step is performed at room temperature (10° C. to 30° C.), an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; and an organic solvent containing a hydrocarbon group such as n-pentane, cyclohexane, n-hexane, benzene, toluene, or xylene.

A difference in solubility between two kinds of solvents with different solubilities is preferably in a range of (100 μg/100 g of solvent) to (90 g/100 g of solvent) and more preferably in a range of (1 mg/100 g of solvent) to (90 g/100 g of solvent). From the viewpoint of adjusting the difference in solubility to be in a range of (100 μg/100 g of solvent) to (90 g/100 g of solvent), for example, in a case where the mixing step is performed at room temperature (10° C. to 30° C.), it is preferable that the solvent x used in the step of obtaining the solution is an organic solvent containing an amide group such as N,N-dimethylacetamide or dimethyl sulfoxide, and the solvent y used in the mixing step is an organic solvent containing a halogenated hydrocarbon group such as methylene chloride or chloroform or an organic solvent containing a hydrocarbon group such as n-pentane, cyclohexane, n-hexane, benzene, toluene, or xylene.

In a case where the perovskite compound is extracted from the obtained dispersion liquid containing the perovskite compound, it is possible to recover only the perovskite compound by performing solid-liquid separation.

Examples of the above-described solid-liquid separation method include a method of performing filtration or the like and a method of using evaporation of a solvent. Only the perovskite compound can be recovered by performing solid-liquid separation.

(Second Embodiment of Method for Producing Perovskite Compound Containing Constituent Components A, B, and X)

The method for producing the perovskite compound may be a production method including a step of adding the component B, the component X, and the component A to a solvent z at a high temperature and dissolving the components therein to obtain a solution h; and a step of cooling the obtained solution h.

More specifically, a production method including a step of adding a compound containing the component B and the component X and a compound containing the component A, or the component A and the component X to a solvent z at a high temperature and dissolving the components therein to obtain a solution h; and a step of cooling the obtained solution h is an exemplary example.

The step of adding a compound containing the component B and the component X and a compound containing the component A, or the component A and the component X to a solvent z at a high temperature and dissolving the components therein to obtain a solution h may be a step of adding a compound containing the component B and the component X and a compound containing the component A, or the component A and the component X to a solvent z and increasing the temperature to obtain a solution h. According to the production method, the perovskite compound according to the present invention can be produced by allowing the perovskite compound according to the present invention to precipitate based on the difference in solubility caused by the difference in temperature.

From the viewpoint of stably dispersing the perovskite compound, it is preferable that the production method includes a step of adding capping ligands. It is preferable that the capping ligands are contained in the solution h before the cooling step.

It is preferable that the production method includes a step of removing coarse particles using a method of carrying out centrifugation or filtration after the cooling step. The size of the coarse particles to be removed by the removal step is preferably 10 µm or greater, more preferably 1 µm or greater, and still more preferably 500 nm or greater.

Here, the solvent z at a high temperature may be a solvent at a temperature at which the compound containing the component B and the component X and the compound containing the component A or the component A and the component X are dissolved. For example, a solvent at 60° C. to 600° C. is preferable, and a solvent at 80° C. to 400° C. is more preferable.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

The solvent z used in the production method is not particularly limited as long as the compound containing the component B and the component X and the compound containing the component A or the component A and the component X are dissolved in the solvent, and examples thereof include an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide, or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide, and 1-octadecene.

In a case where the perovskite compound is extracted from the obtained dispersion liquid containing the perovskite compound, it is possible to recover only the perovskite compound by performing solid-liquid separation.

Examples of the above-described solid-liquid separation method include a method of performing filtration or the like and a method of using evaporation of a solvent. Only the perovskite compound can be recovered by performing solid-liquid separation.

Method for producing composition containing compound (1), silazane or modified product thereof (2), and solvent (3)

For example, the method for producing a composition containing the compound (1), the silazane or modified product thereof (2), and the solvent (3) may be a method (a1) for producing a composition, including a step of mixing the compound (1) with the solvent (3); and a step of mixing the mixture of the compound (1) and the solvent (3) with the silazane or modified product thereof (2) or a method (a2) for producing a composition, including a step of mixing the compound (1) with the silazane or modified product thereof (2); and a step of mixing the mixture of the compound (1) and the silazane or modified product thereof (2) with the solvent (3).

It is preferable that the compound (1) is dispersed in the solvent (3).

For example, a method for producing a composition, including a step of dispersing the compound (1) in the solvent (3) to obtain a dispersion liquid; and a step of mixing the dispersion liquid with the silazane or modified product (2) may be employed.

According to the embodiment, in a case where a composition containing a modified product of the silazane is produced, a method (a3) for producing a composition, including a step of mixing the compound (1) with the solvent (3); a step of mixing the mixture of the compound (1) and the solvent (3) with a silazane (2'); and a step of performing a modification treatment on the mixture of the compound (1), the silazane (2'), and the solvent (3) or a method (a4) for producing a composition, including a step of mixing the compound (1) with the silazane (2'); a step of mixing the mixture of the compound (1) and the silazane (2') with the solvent (3); and a step of performing a modification treatment on the mixture of the compound (1), the silazane (2'), and the solvent (3) may be employed.

From the viewpoint of improving the dispersibility, it is preferable that stirring is performed in the mixing step included in the above-described production method. The temperature in the mixing step included in the above-described production method is not particularly limited, but is preferably in a range of 0° C. to 100° C. and more preferably in a range of 10° C. to 80° C. from the viewpoint of uniformly mixing the mixture. From the viewpoint of improving the dispersibility of the compound (1), it is preferable that the method for producing a composition is the method (a1) or the method (a3).

Method of Performing Modification Treatment

The method of performing the modification treatment included in the above-described production method is not particularly limited as long as the method is a method in which a Si—O—Si bond is formed by substituting N with O in at least some Si—N—Si bonds contained in the silazane. Examples of the method of performing the modification treatment include known methods such as a method of radiating ultraviolet rays and a method of reacting the silazane with water vapor.

Among these, from the viewpoint of forming a stronger protected region in the vicinity of the compound (1), it is preferable that the modification treatment is performed by reacting the silazane with water vapor (hereinafter, also referred to as "a humidification treatment is performed").

The wavelength of ultraviolet rays used in the method of radiating ultraviolet rays is typically in a range of 10 to 400 nm, preferably in a range of 10 to 350 nm, and more preferably in a range of 100 nm to 180 nm. Examples of the light source that generates ultraviolet rays include a metal halide lamp, a high pressure mercury lamp, a low pressure mercury lamp, a xenon arc lamp, a carbon arc lamp, an excimer lamp, and UV laser light.

In a case where the humidification treatment is performed, for example, the composition may be allowed to stand or be stirred for a certain time under the conditions of a temperature and a humidity described below.

From the viewpoint of improving the dispersibility of the silazane contained in the composition, it is preferable that stirring is carried out.

The temperature during the humidification treatment may be a temperature at which the modification sufficiently proceeds and is preferably in a range of 5° C. to 150° C., more preferably in a range of 10° C. to 100° C., and still more preferably in a range of 15° C. to 80° C.

The humidity during the humidification treatment may be a humidity at which the moisture is sufficiently supplied to the compound containing the silazane in the composition and is in a range of 30% to 100%, preferably in a range of 40% to 95%, and more preferably in a range of 60% to 90%.

In the present specification, the "humidity" indicates the relative humidity at a temperature at which the humidification treatment is performed.

The time required for the humidification treatment may be a time at which the modification sufficiently proceeds and is in a range of 10 minutes to 1 week, preferably in a range of 1 hour to 5 days, and more preferably in a range of 12 hours to 3 days.

In the present embodiment, the silazane or modified product thereof (2) or the solvent (3) may be mixed in any step included in the method for producing the compound (1) described above. For example, a production method (a5) including a step of dissolving a compound containing the component B and the component X, a compound containing the component A, or the component A and the component X, and the silazane or modified product thereof (2) in the solvent (3) to obtain a solution g; and a step of mixing the obtained solution g with a solvent y in which the solubility of the perovskite compound therein is lower than that of the solvent (3) used in the step of obtaining the solution or a production method (a6) including a step of adding a compound containing the component B and the component X, a compound containing the component A, or the component A and the component X, and the silazane or modified product thereof (2) to the solvent (3) at a high temperature and dissolving the components therein to obtain a solution h; and a step of cooling the obtained solution h may be employed.

According to the present embodiment, in a case where a composition containing a modified product of the silazane is produced, a production method (a7) including a step of dissolving a compound that contains the component B and the component X, a compound that contains the component A, or the component A and the component X, and the silazane (2') in the solvent (3) to obtain a solution g; a step of mixing the obtained solution g with a solvent y in which the solubility of the perovskite compound therein is lower than that of the solvent (3) used in the step of obtaining the solution; and a step of performing a modification treatment on the mixture of the compound (1), the silazane (2'), and the solvent (3) or a production method (a8) including a step of adding a compound containing the component B and the component X, a compound containing the component A, or the component A and the component X, and the silazane (2') to the solvent (3) at a high temperature and dissolving the components therein to obtain a solution h; a step of cooling the obtained solution h; and a step of performing a modification treatment on the cooled solution h containing the compound (1), the silazane (2'), and the solvent (3) may be employed.

The conditions for each step included in these production methods are the same as those described in the first embodiment and the second embodiment according to the method for producing the perovskite compound described above.

Method for producing composition containing compound (1), silazane or modified product thereof (2), solvent (3), and compound or ion (5)

For example, the method for producing a composition containing the compound (1), the silazane or modified product thereof (2), the solvent (3), and the compound or ion (5) can be carried out in the same manner in the method for producing a composition containing the compound (1), the silazane or modified product thereof (2), and the solvent (3) except that the compound or ion (5) is mixed in any step included in the method for producing the composition containing the compound (1), the silazane or modified product thereof (2), and the solvent (3).

From the viewpoint of improving the dispersibility of the compound (1), it is preferable that the compound or ion (5) is mixed in any step included in the method for producing the perovskite compound (1) containing constituent components A, B, and X. For example, a production method (b1) including a step of dissolving a compound that contains the component B and the component X, a compound that contains the component A, or the component A and the component X, the silazane or modified product thereof (2), and the compound or ion (5) in the solvent (3) to obtain a solution g; and a step of mixing the obtained solution g with a solvent y in which the solubility of the perovskite compound therein is lower than that of the solvent (3) used in the step of obtaining the solution, a production method (b2) including a step of adding a compound that contains the component B and the component X, a compound that contains the component A, or the component A and the component X, and the silazane or modified product thereof (2), and the compound or ion (5) to the solvent (3) at a high temperature and dissolving the mixture therein to obtain a solution h; and a step of cooling the obtained solution h, a production method (b3) including a step of dissolving a compound that contains the component B and the component X, a compound that contains the component A, or the component A and the component X, and the silazane (2'), and the compound or ion (5) in the solvent (3) to obtain a solution g; and a step of mixing the obtained solution g with a solvent y in which the solubility of the perovskite compound therein is lower than that of the solvent (3) used in the step of obtaining the solution; and a step of performing a modification treatment on the mixture of the compound (1), the silazane (2'), the solvent (3), and the compound or ion (5), or a production method (b4) including a step of adding a compound that contains the component B and the component X, a compound that contains the component A, or the component A and the component X, and the silazane (2'), and the compound or ion (5) to the solvent (3) at a high temperature and dissolving the mixture therein to obtain a solution h; a step of cooling the obtained solution h; and a step of performing a modification treatment on the cooled solution h containing the compound (1), the silazane (2'), the solvent (3), and the compound or ion (5) is preferable.

Method for producing composition containing compound (1), silazane or modified product thereof (2), and polymerizable compound or polymer (4)

Examples of the method for producing a composition containing the compound (1), the silazane or modified product thereof (2), and the polymerizable compound or polymer (4) include a method of mixing the compound (1), the silazane or modified product thereof (2), and the polymerizable compound or polymer (4).

From the viewpoint of improving the dispersibility of the compound (1), it is preferable that the step of mixing the compound (1), the silazane or modified product thereof (2), and the polymerizable compound or polymer (4) is performed by stirring the mixture.

In the step of mixing the compound (1), the silazane or modified product thereof (2), and the polymerizable compound or polymer (4), the temperature is not particularly limited, but is preferably in a range of 0° C. to 100° C. and more preferably in a range of 10° C. to 80° C. from the viewpoint of uniformly mixing the mixture.

The method for producing the composition containing the compound (1), the silazane or modified product thereof (2), and the polymerizable compound or polymer (4) may be a production method (c1) including a step of dispersing the compound (1) in the polymerizable compound or polymer (4) to obtain a dispersion; and a step of mixing the obtained dispersion with the silazane or modified product thereof (2), a production method (c2) including a step of dispersing the silazane or modified product thereof (2) in the polymerizable compound or polymer (4) to obtain a dispersion; and a step of mixing the obtained dispersion with the compound (1), or a production method (c3) including a step of dispersing the mixture of the compound (1) and the silazane or modified product thereof (2) in the polymerizable compound or polymer (4).

Among the production methods (c1) to (c3), the production method (c1) is preferable from the viewpoint of improving the dispersibility of the compound (1). According to the method described above, the composition of the present invention can be obtained as a mixture of the dispersion in which the compound (1) is dispersed in the polymerizable compound or polymer (4) and the silazane or modified product thereof (2).

In the steps of obtaining each dispersion included in the production methods (c1) to (c3), the polymerizable compound or polymer (4) may be added dropwise to the compound (1) and/or the silazane or modified product thereof (2), or the compound (1) and/or the silazane or modified product thereof (2) may be added dropwise to the polymerizable compound or polymer (4).

From the viewpoint of improving the dispersibility, it is preferable that the compound (1) and/or the silazane or modified product thereof (2) is added dropwise to the polymerizable compound or polymer (4).

In each mixing step included in the production methods (c1) to (c3), the compound (1) or the silazane or modified product thereof (2) may be added dropwise to the dispersion, or the dispersion may be added dropwise to the compound (1) or the silazane or modified product thereof (2).

From the viewpoint of improving the dispersibility, it is preferable that the compound (1) or the silazane or modified product thereof (2) is added dropwise to the dispersion.

In a case where a polymer is employed as the polymerizable compound or the polymer (4), the polymer may be a polymer in a state of being dissolved in a solvent.

The solvent in which the above-described polymer is dissolved is not particularly limited as long the polymer (resin) can be dissolved in the solvent, but a solvent in which the compound (1) according to the present invention is unlikely to be dissolved is preferable.

Examples of the solvent include an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an alcohol such as methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, or 2,2,3,3-tetrafluoro-1-propanol; a glycol ether such as ethylene glycol monomethyl ether, ethylene glycol monoethyl ether, ethylene glycol monobutyl ether, ethylene glycol monoethyl ether acetate, or triethylene glycol dimethyl ether; an organic solvent containing an amide group such as N,N-dimethylformamide, acetamide or N,N-dimethylacetamide; an organic solvent containing a nitrile group such as acetonitrile, isobutyronitrile, propionitrile, or methoxy acetonitrile; an organic solvent containing a carbonate group such as ethylene carbonate or propylene carbonate; an organic solvent containing a halogenated hydrocarbon group such as methylene chloride or chloroform; an organic solvent containing a hydrocarbon group such as n-pentane, cyclohexane, n-hexane, benzene, toluene, or xylene; and dimethyl sulfoxide.

Among these, an ester such as methyl formate, ethyl formate, propyl formate, pentyl formate, methyl acetate, ethyl acetate, or pentyl acetate; a ketone such as γ-butyrolactone, N-methyl-2-pyrrolidone, acetone, dimethyl ketone, diisobutyl ketone, cyclopentanone, cyclohexanone, or methyl cyclohexanone; an ether such as diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, or phenetole; an organic solvent containing a nitrile group such as acetonitrile, isobutyronitrile, propionitrile, or methoxyacetonitrile; an organic solvent containing a carbonate group such as ethylene carbonate or propylene carbonate; an organic solvent containing a halogenated hydrocarbon group such as methylene chloride or chloroform; or an organic solvent containing a hydrocarbon group such as n-pentane, cyclohexane, n-hexane, benzene, toluene, or xylene is preferable from the viewpoint that the polarity is low and the compound (1) according to the present invention is unlikely to be dissolved therein, and an organic solvent containing a halogenated hydrocarbon group such as methylene chloride or chloroform; or an organic solvent containing a hydrocarbon group such as n-pentane, cyclohexane, n-hexane, benzene, toluene, or xylene is more preferable.

Further, the method for producing the composition according to the present embodiment may be a method (c4) for producing a composition, including a step of dispersing the compound (1) in the solvent (3) to obtain a dispersion liquid; a step of mixing the dispersion liquid with the polymerizable compound or polymer (4) to obtain a mixed solution; and a step of mixing the mixed solution with the silazane or modified product thereof (2).

The method for producing the composition according to the present embodiment may be a method (c5) for producing a composition, including: a step of dispersing the compound (1) in the solvent (3) to obtain a dispersion liquid; a step of mixing the dispersion liquid with the silazane (2') to obtain a mixed solution; a step of performing a modification treatment on the mixed solution to obtain a mixed solution containing a modified product of silazane; and a step of mixing the mixed solution containing the modified product of silazane with a polymerizable compound or polymer (4).

Method for producing composition containing compound (1), silazane or modified product thereof (2), polymerizable compound or polymer (4), and compound or ion (5)

The method for producing a composition containing the compound (1), the silazane or modified product thereof (2), the polymerizable compound or polymer (4), and the compound or ion (5) can be carried out in the same manner in the method for producing a composition containing the compound (1), the silazane or modified product thereof (2), and the polymerizable compound or polymer (4) except that the compound or ion (5) is added.

The compound or ion (5) may be added in any steps included in the method for producing the perovskite compound (1) containing the constituent components A, B, and X or may be added in any steps included in the method for producing the composition containing the compound (1), the silazane or modified product thereof (2), and the polymerizable compound or polymer (4).

From the viewpoint of improving the dispersibility of the compound (1), it is preferable that the compound or ion (5) is added in any steps included in the method for producing the perovskite compound (1) containing the constituent components A, B, and X. In the method for producing the composition containing the compound (1), the silazane or modified product thereof (2), the polymerizable compound or polymer (4), and the compound or ion (5), the solvent (3) may be used. In this manner, for example, the composition according to the present embodiment can be obtained as a mixture of a dispersion obtained by dispersing the compound (1) in which at least a part thereof is coated with the compound or ion (5) in the solvent (3), a dispersion obtained by dispersing the silazane or modified product thereof (2) in the solvent (3), and the polymerizable compound or polymer (4) or a mixture of a dispersion obtained by dispersing the compound (1) in which at least a part thereof is coated with the compound or ion (5) and the silazane or modified product thereof (2) in the solvent (3), and the polymerizable compound or polymer (4).

Method for producing composition which contains compound (1), silazane or modified product thereof (2), and polymer (4') and in which total amount of compound (1), silazane or modified product thereof (2), and polymer (4') is 90% by mass or greater with respect to the total mass of the composition Examples of the method for producing the composition which contains the compound (1), the silazane or modified product thereof (2), and the polymer (4') and in which the total amount of the compound (1), the silazane or modified product thereof (2), and the polymer (4') is 90% by mass or greater with respect to the total mass of the composition include a production method including a step of mixing the compound (1), the silazane or modified product thereof (2), and the polymerizable compound; and a step of polymerizing the polymerizable compound, and a production method including a step of mixing the compound (1), the silazane or modified product thereof (2) and the polymer dissolved in a solvent; and a step of removing the solvent.

As the mixing step included in the production method, the same mixing method as the method for producing the composition containing the compound (1), the silazane or modified product thereof (2), and the polymerizable compound or polymer (4) described above can be used.

The production method may be, for example, a production method (d1) including a step of dispersing the compound (1) in the polymerizable compound to obtain a dispersion, a step of mixing the obtained dispersion and the silazane or modified product thereof (2), and a step of polymerizing the polymerizable compound; a production method (d2) including a step of dispersing the compound (1) in the polymer dissolved in a solvent to obtain a dispersion, a step of mixing the obtained dispersion and the silazane or modified product thereof (2), and a step of removing the solvent; a production method (d3) including a step of dispersing the silazane or modified product thereof (2) in the polymerizable compound to obtain a dispersion, a step of mixing the obtained dispersion with the compound (1), and a step of polymerizing the polymerizable compound; a production method (d4) including a step of dispersing the silazane or modified product thereof (2) in the polymer dissolved in a solvent to obtain a dispersion, a step of mixing the obtained dispersion with the compound (1), and a step of removing the solvent; a production method (d5) including a step of dispersing the mixture of the compound (1) and the silazane or modified product thereof (2) in the polymerizable compound and a step of polymerizing the polymerizable compound; or a production method (d6) including a step of dispersing the mixture of the compound (1) and the silazane or modified product thereof (2) in the polymer dissolved in a solvent and a step of removing the solvent.

The step of removing the solvent included in the production method may be a step of allowing the solvent to stand at room temperature so as to be naturally dried or a step of evaporating the solvent by being heated or dried under reduced pressure using a vacuum dryer.

For example, the solvent can be removed by being dried in a temperature range of 0° C. to 300° C. for 1 minute to 7 days.

The step of polymerizing the polymerizable compound included in the production method can be performed by appropriately using a known polymerization reaction such as radical polymerization.

For example, in a case of the radical polymerization, the polymerization reaction can be allowed to proceed by adding a radical polymerization initiator to the mixture of the compound (1), the silazane or modified product thereof (2), and the polymerizable compound to generate a radical. The radical polymerization initiator is not particularly limited, and examples thereof include a photoradical polymerization initiator. As the photoradical polymerization initiator, bis(2,4,6-trimethylbenzoyl)-phenylphosphine oxide is exemplary example.

Method for producing composition which contains compound (1), silazane or modified product thereof (2), polymer (4'), and compound or ion (5) and in which total amount of compound (1), silazane or modified product thereof (2), polymer (4'), and compound or ion (5) is 90% by mass or greater with respect to the total mass of composition The method for producing the composition which contains the compound (1), the silazane or modified product thereof (2), the polymer (4'), and the compound or ion (5) and in which the total amount of the compound (1), the silazane or modified product thereof (2), the polymer (4'), and the compound or ion (5) is 90% by mass or greater with respect to the total mass of the composition may be the same as the above-described method for producing the composition which contains the compound (1), the silazane or modified product thereof (2), and the polymer (4') and in which the total amount of the compound (1), the silazane or modified product thereof (2), and the polymer (4') is 90% by mass or greater with respect to the total mass of the composition except that the compound or ion (5) is added in any steps included in the method for producing the composition which contains the compound (1), the silazane or modified product thereof (2), and the polymer (4') and in which the total amount of the compound (1), the silazane or modified product thereof (2), and the polymer (4') is 90% by mass or greater with respect to the total mass of the composition.

The compound or ion (5) may be added in any steps included in the method for producing the perovskite compound described above, in the step of mixing the compound (1), the silazane or modified product thereof (2), and the polymerizable compound, or in the step of mixing the compound (1), the silazane or modified product thereof (2), and the polymer dissolved in a solvent. From the viewpoint of improving the dispersibility of the perovskite compound, it is preferable that the compound or ion (5) is added in any steps included in the method for producing the perovskite compound (1) containing the constituent components A, B, and X.

<<Measurement of Perovskite Compound>>

The amount of the perovskite compound contained in the composition of the present invention is measured using an inductively coupled plasma spectrometer ICP-MS (for example, ELAN DRCII, manufactured by PerkinElmer, Inc.) and ion chromatography (for example, Integrion, manufactured by ThermoFisher Scientific Inc.).

The measurement of each component is performed after the perovskite compound is dissolved in a good solvent such as N,N-dimethylformamide.

<<Measurement of Emission Spectrum>>

The emission spectrum of the composition according to the present invention is measured with excitation light having a wavelength of 450 nm at room temperature in the atmosphere using an absolute PL quantum yield measuring device (C9920-02, manufactured by Hamamatsu Photonics K. K.).

In the composition containing the compound (1), the silazane or modified product thereof (2), and the solvent (3), the emission spectrum is measured by adjusting the concentration of the perovskite compound contained in the composition to 1500 ppm (μg/g).

<<Measurement of Quantum Yield>>

The quantum yield of the composition according to the present invention is measured with excitation light having a wavelength of 450 nm at room temperature in the atmosphere using an absolute PL quantum yield measuring device (C9920-02, manufactured by Hamamatsu Photonics K. K.).

In the composition containing the compound (1), the silazane or modified product thereof (2), and the solvent (3), the quantum yield is measured by adjusting the concentration of the perovskite compound contained in the composition to 200 ppm (μg/g) using toluene.

In the composition containing the compound (1), the silazane or modified product thereof (2), and the polymerizable compound or polymer (4), the quantum yield is measured by adjusting the mixing ratio such that the concentration of the perovskite compound contained in the composition is set to 1000 μg/mL. The same applies to a case where the polymerizable compound or polymer (4) is replaced with the polymer (4').

In the composition according to the present embodiment, the quantum yield measured according to the above-described measuring method may be 32% or greater, 40% or greater, 45% or greater, or 50% or greater.

In the composition according to the present embodiment, the quantum yield measured according to the above-described measuring method may be 100% or less. The above-described upper limit and lower limit can be combined as desired.

According to one aspect of the present invention, the quantum yield measured according to the above-described measuring method in the composition according to the present embodiment is preferably in a range of 32% to 100%, more preferably in a range of 40% to 100%, still more preferably in a range of 45% to 100%, and particularly preferably in a range of 50% to 100%.

<<Evaluation 1 of Durability with Respect to Water Vapor>>

The composition of the present invention is prepared to have a thickness of 100 μm and a size of 1 cm×1 cm and placed in a thermohygrostat bath under a constant condition of a temperature of 60° C. and a humidity of 80%, and a test for the durability with respect to water vapor is performed. The quantum yield is measured before and after the test, and the value of (quantum yield after test for durability with respect to water vapor during X' days)/(quantum yield before test for durability with respect to water vapor) is calculated as an index of the durability with respect to water vapor.

In the composition according to the present embodiment, the durability after the test for the durability with respect to water vapor for 3 days measured using the above-described measuring method may be 0.4 or greater, 0.6 or greater, or 0.7 or greater.

In the composition according to the present embodiment, the durability after the test for the durability with respect to water vapor for 3 days measured using the above-described measuring method may be 1.0 or less.

According to another aspect of the present invention, in the composition according to the present embodiment, the thermal durability after the test for the thermal durability for 3 days measured using the above-described measuring method is preferably in a range of 0.4 to 1.0, more preferably in a range of 0.6 to 1.0, and still more preferably in a range of 0.7 to 1.0.

In the composition according to the present embodiment, the durability after the test for the durability with respect to water vapor for 5 days measured using the above-described measuring method may be 0.4 or greater, 0.6 or greater, or 0.7 or greater.

In the composition according to the present embodiment, the durability after the test for the durability with respect to water vapor for 5 days measured using the above-described measuring method may be 1.0 or less.

According to another aspect of the present invention, in the composition according to the present embodiment, the thermal durability after the test for the thermal durability for 5 days measured using the above-described measuring method is preferably in a range of 0.4 to 1.0, more preferably in a range of 0.6 to 1.0, and still more preferably in a range of 0.7 to 1.0.

In the composition according to the present embodiment, the durability after the test for the durability with respect to water vapor for 5 days measured using the above-described measuring method may be 0.4 or greater, 0.6 or greater, 0.7 or greater, or 0.8 or greater.

In the composition according to the present embodiment, the durability after the test for the durability with respect to water vapor for 7 days measured using the above-described measuring method may be 1.0 or less.

According to another aspect of the present invention, in the composition according to the present embodiment, the thermal durability after the test for the thermal durability for 7 days measured using the above-described measuring method is preferably in a range of 0.4 to 1.0, more preferably in a range of 0.6 to 1.0, still more preferably in a range of 0.7 to 1.0, and particularly preferably in a range of 0.8 to 1.0.

<<Evaluation 2 of Durability with Respect to Water Vapor>>

5 mL of the composition containing a dispersion liquid of the present invention is placed in a thermohygrostat bath under a constant condition of a temperature of 25° C. and a humidity of 80%, and a test for the durability with respect to water vapor is performed.

The emission spectrum is measured before and after the test, and the absolute value of (peak wavelength (nm) of emission spectrum before test for durability with respect to water vapor)−(peak wavelength (nm) of emission spectrum after test for durability with respect to water vapor for 1 day) is calculated as an index of the durability with respect to water vapor.

In the composition according to the present embodiment, the durability with respect to water vapor after the test for the durability with respect to water vapor for 1 day measured using the above-described measuring method may be 60 nm or less, 30 nm or less, or 10 nm or less.

In the composition according to the present embodiment, the durability with respect to water vapor after the test for the durability with respect to water vapor for 1 day measured using the above-described measuring method may be 0.1 nm or greater.

According to another aspect of the present invention, in the composition according to the present embodiment, the durability with respect to water vapor after the test for the durability with respect to water vapor for 1 day measured using the above-described measuring method is preferably in a range of 0.1 to 60 nm, more preferably in a range of 0.1 to 30 nm, and still more preferably in a range of 0.1 to 10 nm.

<Film>

A film according to the present invention is a film formed of the composition which contains the compound (1), the silazane or modified product thereof (2), and the polymer (4') and in which the total content ratio of the compound (1), the silazane or modified product thereof (2), and the polymer (4') is 90% by mass or greater with respect to the total mass of the composition. The composition may contain the compound or ion (5).

The shape of the film is not particularly limited, and the film can be formed in an optional shape such as a sheet shape or a bar shape. In the present specification, the "bar shape" indicates a shape having an anisotropy. As the shape having an anisotropy, a shape of a plate having sides with different lengths is an exemplary example.

The thickness of the film may be in a range of 0.01 μm to 1000 mm, in a range of 0.1 μm to 10 mm, or in a range of 1 μm to 1 mm.

The thickness of the film in the present specification can be obtained by measuring the thicknesses of the film at optional three points using a micrometer and calculating the average value of the measured values.

The film may be formed of a single layer or a plurality of layers. In a case of a plurality of layers, the same kind of composition according to the embodiment may be used for each layer or different kinds of composition according to the embodiment may be used for each layer.

The film can be obtained as a film formed on a substrate according to a method (i) to (iV) for producing a laminated structure described below. Further, the film can be obtained by being peeled off from the substrate.

<Laminated Structure>

The laminated structure according to the present invention has a plurality of layers, and at least one layer is the above-described film.

Among the plurality of layers included in the laminated structure, examples of layers other than the above-described film include optional layers such as a substrate, a barrier layer, and a light scattering layer.

The shape of the film to be laminated is not particularly limited, and the film can be formed in an optional shape such as a sheet shape or a bar shape.

(Substrate)

The layer which may be included in the laminated structure according to the present invention is not particularly limited, and examples thereof include a substrate.

The substrate is not particularly limited and may be a film. From the viewpoint of extracting light at the time of light emission, a transparent substrate is preferable. As the substrate, a polymer such as polyethylene terephthalate or known materials such as glass can be used.

For example, the above-described film may be provided on the substrate in the laminated structure.

FIG. 1 is a cross-sectional view schematically showing the configuration of the laminated structure according to the present embodiment. A film 10 according to the present embodiment may be provided between a first substrate 20 and a second substrate 21 in a first laminated structure 1a. The film 10 is sealed by a sealing layer 22.

According to one aspect of the present invention, the laminated structure 1a includes the first substrate 20, the second substrate 21, the film 10 according to the present embodiment which is positioned between the first substrate 20 and the second substrate 21, and the sealing layer 22 and is configured such that the sealing layer is disposed on a surface that does not contact with the first substrate 20 and the second substrate 21 of the film 10.

(Barrier Layer)

The layer which may be included in the laminated structure according to the present invention is not particularly limited, and examples thereof include a barrier layer. The laminated structure may include a barrier layer from the viewpoint that the barrier layer protects the above-described composition from water vapor in outside air or the air in the atmosphere.

The barrier layer is not particularly limited, and a transparent barrier layer is preferable from the viewpoint of extracting emitted light. For example, a polymer such as polyethylene terephthalate or a known barrier layer such as a glass film can be used as the barrier layer.

(Light Scattering Layer)

The layer which can be included in the laminated structure according to the present invention is not particularly limited, and examples thereof include a light scattering layer. From the viewpoint of efficiently utilizing incident light, the laminated structure may include a light scattering layer.

The light scattering layer is not particularly limited, and a transparent light scattering layer is preferable from the viewpoint of extracting emitted light. For example, light scattering particles such as silica particles or a known light scattering layer such as an amplified diffusion film can be used.

<Light-Emitting Device>

A light-emitting device according to the present invention can be obtained by combining the composition according to the embodiment of the present invention or the laminated structure described above with a light source. The light-emitting device is a device that extracts light by irradiating the laminated structure or the composition placed on the back stage with light emitted from the light source and allowing the composition or the laminated structure to emit light. Among a plurality of layers included in the laminated structure in the light-emitting device, examples of layers other than the film, the substrate, the barrier layer, and the light scattering layer include optional layers such as a light reflection member, a brightness-reinforcing film, a prism sheet, a light-guiding plate, and a medium material layer between elements.

According to one aspect of the present invention, a light-emitting device 2 is formed by laminating a prism sheet 50, a light-guiding plate 60, the first laminated structure 1a, and a light source 30 in this order.

(Light Source)

The light source constituting the light-emitting device according to the present invention is not particularly limited. However, from the viewpoint of allowing the composition described above or semiconductor fine particles in the laminated structure to emit light, a light source having an emission wavelength of 600 nm or less is preferable. Examples of the light source include known light sources, for example, a light-emitting diode (LED) such as a blue light-emitting diode, a laser, and an EL.

(Light Reflection Member)

The layer which may be included in the laminated structure constituting the light-emitting device according to the present invention is not particularly limited, and examples thereof include a light reflection member. From the viewpoint of irradiating the composition described above or the laminated structure with light from the light source, the laminated structure may include the light reflection member. The light reflection member is not particularly limited and may be a reflective film.

The reflective film is not particularly limited, and examples thereof include known reflective films such as a reflecting mirror, a film formed of reflective particles, a reflective metal film, and a reflector.

(Brightness-Reinforcing Unit)

The layer which may be included in the laminated structure constituting the light-emitting device according to the present invention is not particularly limited, and examples thereof include a brightness-reinforcing unit. From the viewpoint of reflecting partial light to be returned to the direction in which the light is transmitted, the laminated structure may include the brightness-reinforcing unit.

(Prism Sheet)

The layer which may be included in the laminated structure constituting the light-emitting device according to the present invention is not particularly limited, and examples thereof include a prism sheet. A prism sheet typically includes a base material portion and a prism portion. Further, the base material portion may not be provided depending on a member adjacent to the base material portion. The prism sheet is obtained by being bonded to a member adjacent thereto through an optional appropriate adhesion layer (for example, an adhesive layer or a pressure sensitive adhesive layer). The prism sheet is configured such that a plurality of unit prisms which become projections are arranged in parallel with one another on a side (rear side) opposite to a viewing side. Light transmitted through the prism sheet is likely to be focused by arranging the projections of the prism sheet toward the rear side. Further, in a case where the projections of the prism sheet are arranged toward the rear side, the quantity of light to be reflected without being incident on the prism sheet is small compared to a case where the projections are arranged toward the viewing side, and a display with high brightness can be obtained.

(Light-Guiding Plate)

The layer which may be included in the laminated structure constituting the light-emitting device according to the present invention is not particularly limited, and examples thereof include a light-guiding plate. As the light-guiding plate, an optional appropriate light-guiding plate such as a light-guiding plate in which a lens pattern is formed on the rear side such that light from the lateral direction can be deflected in the thickness direction or a light-guiding plate in which a prism shape or the like is formed on the rear side and/or the viewing side is used.

(Medium Material Layer Between Elements)

The layer which may be included in the laminated structure constituting the light-emitting device according to the present invention is not particularly limited, and examples thereof include a layer (medium material layer between elements) formed of one or more medium materials on an optical path between elements (layers) adjacent to each other.

One or more mediums included in the medium material layer between element are not particularly limited, and examples thereof include vacuum, air, gas, an optical material, an adhesive, an optical adhesive, glass, a polymer, a solid, a liquid, a gel, a curing material, an optical bonding material, a refractive index matching or refractive index mismatching material, a refractive index gradient material, a cladding or anti-gladding material, a spacer, a silica gel, a brightness-reinforcing material, a scattering or diffusing material, a reflective or anti-reflective material, a wavelength selective material, a wavelength selective anti-reflective material, a color filter, and suitable media known in the technical field.

Specific examples of the light-emitting device according to the present invention include those provided with wavelength conversion materials for an EL display and a liquid crystal display.

Specific examples thereof include a backlight (E1) (on-edge type backlight) that converts blue light to green light or red light by putting the composition of the present invention into a glass tube or the like so as to be sealed and disposing the glass tube or the like between a light-guiding plate and a blue light-emitting diode serving as a light source such that the glass tube or the like is along with an end surface (side surface) of the light-guiding plate; a backlight (E2) (surface-mounting type backlight) that converts blue light to be applied to a sheet after passing through a light-guiding plate from a blue light-emitting diode placed on an end surface (side surface) of the light-guiding plate to green light or red light by forming the sheet using the composition of the present invention and placing a film obtained by interposing the sheet between two barrier films so as to be sealed on the light-guiding plate; a backlight (E3) (on-chip type backlight) that converts blue light to be applied to green light or red light by dispersing the composition of the present invention in a resin or the like and placing the resin or the like in the vicinity of a light-emitting unit of a blue light-emitting diode; and a backlight (E4) that converts blue light to be applied from a light source to green light or red light by dispersing the composition of the present invention in a resist and placing the resist on a color filter.

Further, specific examples of the light-emitting device according to the present invention include an illumination emitting white light which is obtained by forming the composition according to the embodiment of the present invention, disposing the composition on a back stage of a blue light-emitting diode serving as a light source, and converting blue light to green light or red light.

<Display>

Figure 2:
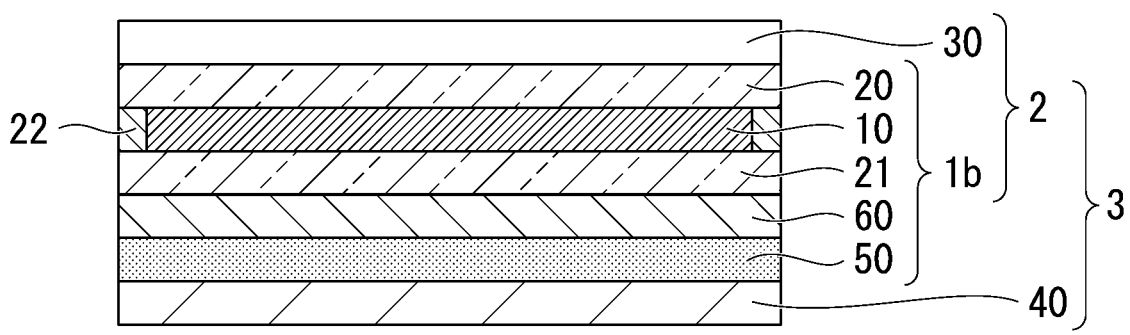
FIG. 2 is a cross-sectional view showing an embodiment of a display according to the present invention.

As shown in FIG. 2, a display 3 according to the present embodiment includes a liquid crystal panel 40 and the light-emitting device 2 described above in this order from the viewing side. The light-emitting device 2 includes a second laminated structure 1b and a light source 30. The second laminated structure 1b is formed of the first laminated structure 1a which further includes a prism sheet 50 and a light-guiding plate 60. The display may further include other appropriate optional members.

According to one aspect of the present invention, the display is the liquid crystal display 3 obtained by laminating the liquid crystal panel 40, the prism sheet 50, the light-guiding plate 60, the first laminated structure 1a, and the light source 30 in this order.

(Liquid Crystal Panel)

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell. The viewing-side polarizing plate and the rear-surface-side polarizing plate can be disposed such that respective absorption axes are substantially orthogonal or parallel to each other.

(Liquid Crystal Cell)

The liquid crystal cell includes a pair of substrates; and a liquid crystal layer serving as a display medium interposed between the substrates. In a typical configuration, a color filter and a black matrix are provided on one substrate. Further, a switching element that controls electro-optical characteristics of a liquid crystal; a scanning line that sends a gate signal to the switching element and a signal line that sends a source signal to the switching element; and a pixel electrode and a counter electrode are provided on the other substrate. The interval (cell gap) between the substrates can be controlled by a spacer or the like. For example, an alignment film formed of polyimide can be provided on a side of the substrate contact in the liquid crystal layer.

(Polarizing Plate)

The polarizing plate typically includes a polarizer; and a protective layer disposed on both sides of the polarizer. Typically, the polarizer is an absorption type polarizer. As the polarizer, an appropriate optional polarizer is used. Examples thereof include a polarizer obtained by adsorbing a dichroic material such as iodine or a dichroic dye on a hydrophilic polymer such as a polyvinyl alcohol-based film, a partially formalized polyvinyl alcohol-based film, or an ethylene-vinyl acetate copolymer-based partially saponified film so as to be uniaxially stretched; and a polyene-based alignment film such as a dehydrated product of polyvinyl alcohol or a dehydrochlorinated product of polyvinyl chloride. Among these, a polarizer obtained by adsorbing a dichroic material such as iodine on a polyvinyl alcohol-based film so as to be uniaxially stretched is particularly preferable from the viewpoint of a high dichroic ratio.

As the applications of the composition according to the present invention, a wavelength conversion material for a light-emitting diode (LED) is an exemplary example.

<LED>

The composition according to the present invention can be used as a material for a light-emitting layer of an LED.

As the LED containing the composition of the present invention, an LED which has a structure in which the composition of the present invention and conductive particles such as ZnS are mixed and laminated in a film shape, an n-type transport layer is laminated on one surface, and a p-type transport layer is laminated on the other surface and emits light by circulating the current so that positive holes of a p-type semiconductor and electrons of an n-type semiconductor cancel the charge in the particles in the compound (1) and the silazane or modified product thereof (2) contained in the bonding surface of the composition is an exemplary example.

<Solar Cell>

The composition of the present invention can be used as an electron transport material contained in an active layer of a solar cell.

The configuration of the solar cell is not particularly limited, and examples thereof include a solar cell which includes a fluorine-doped tin oxide (FTO) substrate, a titanium oxide dense layer, a porous aluminum oxide layer, an active layer containing the composition of the present invention, a hole transport layer such as 2,2',7,7'-tetrakis-(N,N'-di-p-methoxyphenylamine)-9,9'-spirobifluorene (Spiro-MeOTAD), and a silver (Ag) electrode in this order.

The titanium oxide dense layer has a function of transporting electrons, an effect of suppressing the roughness of FTO, and a function of suppressing movement of inverse electrons.

The porous aluminum oxide layer has a function of improving the light absorption efficiency. The composition of the present invention which is contained in the active layer plays a role of charge separation and electron transport.

<Method for Producing Laminated Structure>

The method for producing a laminated structure may be a method (i) for producing a laminated structure, including a step of mixing the compound (1), the silazane or modified product thereof (2), the solvent (3), and the polymer (4'), a step of coating a substrate with the obtained mixture, and a step of removing the solvent; a method (ii) for producing a laminated structure, including a step of mixing the compound (1), the silazane or modified product thereof (2), and the polymer dissolved in a solvent, a step of coating a substrate with the obtained mixture, and a step of removing the solvent; a method (iii) for producing a laminated structure, including a step of laminating the composition, which contains the compound (1), the silazane or modified product thereof (2), and the polymer (4') and in which the total amount of the compound (1), the silazane or modified product thereof (2), and the polymer (4') is 90% by mass or greater with respect to the total mass of the composition, on a substrate; or a production method (iv) including a step of mixing the compound (1), the silazane or modified product thereof (2), and the polymerizable compound, a step of coating a substrate with the obtained mixture, and a step of polymerizing the polymerizable compound.

The mixing step and the step of removing the solvent which are included in the production method (i), the mixing step and the step of removing the solvent which are included in the production method (ii), and the mixing step and the step of polymerizing the polymerizable compound which are included in the production method (iv) can be designed to be the same steps as those included in the above-described method for producing the composition which contains the compound (1), the silazane or modified product thereof (2), and the polymer (4') and in which the total amount of the compound (1), the silazane or modified product thereof (2), and the polymer (4') is 90% by mass with respect to the total mass of the composition.

Each step of coating a substrate with the mixture, included in the production methods (i), (ii), and (iv) is not particularly limited and can be carried out using a known coating method such as a gravure coating method, a bar coating method, a printing method, a spray method, a spin coating method, a dip method, or a die coating method.

In the step of laminating the mixture on the substrate, included in the production method (iii), an optional adhesive can be used.

The adhesive is not particularly limited as long as the compound (1) and the silazane or modified product thereof (2) are not dissolved therein, and a known adhesive can be used.

The method for producing a laminated structure may be a production method including a step of further laminating an optional film on the laminated structure obtained by the production methods (i) to (iv).

Examples of optional films to be laminated include a reflective film and a diffusion film.

An optional adhesive can be used in the step of laminating the film on the substrate. The above-described adhesive is not particularly limited as long as the compound (1) and the silazane or modified product thereof (2) are not dissolved therein, and a known adhesive can be used.

<Method for Producing Light-Emitting Device>

A production method including a step of placing the light source, the composition on the optical path of a back stage from the light source, or the laminated structure is an exemplary example.

Further, the technical scope of the present invention is not limited to the above-described embodiments, and various modifications can be added within the range not departing from the spirit of the present invention.

EXAMPLES

Hereinafter, the embodiments of the present invention will be described in more detail based on examples and comparative example, but the present invention is not limited to the following examples.

(Measurement of Concentration of Perovskite Compound)

The concentration of the perovskite compound in each composition obtained in Examples 1 to 13 and Comparative Examples 1 to 3 was obtained by adding N,N-dimethylformamide to the dispersion liquid containing the solvent and the perovskite compound which was obtained by re-dispersion, dissolving the perovskite compound therein, and measuring the concentration using ICP-MS (ELAN DRCII, manufactured by PerkinElmer, Inc.) and ion chromatography (Integrion, manufactured by ThermoFisher Scientific Inc.).

(Measurement of Quantum Yield)

The quantum yield of each composition obtained in Examples 1 to 13 and Comparative Examples 1 to 3 was measured with excitation light having a wavelength of 450 nm at room temperature in the atmosphere using an absolute PL quantum yield measuring device (C9920-02, manufactured by Hamamatsu Photonics K. K.).

(Evaluation 1 of Durability with Respect to Water Vapor)

Each composition obtained in Examples 1 to 13 and Comparative Examples 1 to 3 was prepared to have a thickness of 100 μm and a size of 1 cm×1 cm and placed in an oven under a constant condition of a temperature of 60° C. and a humidity of 80%, and the quantum yield thereof was measured with excitation light having a wavelength of 450 nm at room temperature in the atmosphere after 3 days, 5 days, or 7 days using an absolute PL quantum yield measuring device (C9920-02, manufactured by Hamamatsu Photonics K. K.).

The quantum yield was evaluated based on the value of (quantum yield after test for durability with respect to water vapor during X' days)/(quantum yield before test for durability with respect to water vapor) as an index of the durability with respect to water vapor. X' is 3, 5, or 7.

(Synthesis of Composition)

Example 1

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As the result of measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present. The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound the solvent was mixed with 0.913 g of the solution in which the polymer was dissolved, and the resulting solution was further mixed with an organopolysilazane (Durazane 1500 Rapid Cure, manufactured by Merck Performance Materials Ltd.) in an aluminum cup (4.5 φcm), thereby obtaining a composition. In the composition, the molar ratio of Si/Pb was 6.68.

Further, a composition in which the concentration of the perovskite compound was 1000 μg/mL was obtained by naturally drying the toluene to be evaporated. The composition was cut into a size of 1 cm×1 cm.

The quantum yield before the test for the durability with respect to water vapor was 42%, and the quantum yield after 5 days from the test for the durability with respect to water vapor was 28%. The value of (quantum yield after 5 days from test for durability with respect to water vapor)/(quantum yield before test for durability with respect to water vapor) was 0.67.

Example 2

A composition having a size of 1 cm×1 cm was obtained according to the same method as that of Example 1 except that the molar ratio of Si/Pb was set to 20.0.

The quantum yield before the test for the durability with respect to water vapor was 45%, and the quantum yield after 5 days from the test for the durability with respect to water vapor was 34%. The value of (quantum yield after 5 days from test for durability with respect to water vapor)/(quantum yield before test for durability with respect to water vapor) was 0.76.

Example 3

A composition having a size of 1 cm×1 cm was obtained according to the same method as that of Example 1 except that the molar ratio of Si/Pb was set to 66.8.

The quantum yield before the test for the durability with respect to water vapor was 50%, and the quantum yield after 5 days from the test for the durability with respect to water vapor was 31%. The value of (quantum yield after 5 days from test for durability with respect to water vapor)/(quantum yield before test for durability with respect to water vapor) was 0.62.

Example 4

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 µL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (µg/g).

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound the solvent was mixed with 0.913 g of the solution in which the polymer was dissolved, and the resulting solution was further mixed with an organopolysilazane (Durazane 1500 Slow Cure, manufactured by Merck Performance Materials Ltd.) in an aluminum cup (4.5 φcm), thereby obtaining a composition. In the composition, the molar ratio of Si/Pb was 76.0.

Further, a composition in which the concentration of the perovskite compound was 1000 µg/mL was obtained by naturally drying the toluene to be evaporated. The composition was cut into a size of 1 cm×1 cm.

The quantum yield before the test for the durability with respect to water vapor was 45%, and the quantum yield after 5 days from the test for the durability with respect to water vapor was 27%. The value of (quantum yield after 5 days from test for durability with respect to water vapor)/(quantum yield before test for durability with respect to water vapor) was 0.60.

Example 5

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 µL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, an organopolysilazane (Durazane 1500 Rapid Cure, manufactured by Merck Performance Materials Ltd.) was mixed into the above-described dispersion liquid. In the composition, the molar ratio of Si/Pb was 20.0.

The above-described dispersion liquid was subjected to a modification treatment for 1 day while being stirred using a stirrer at 25° C. under a humidity condition of 80%. Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound, the modified product of polysilazane, and the solvent was mixed with 0.913 g of the solution in which the polymer was dissolved to obtain a composition.

Further, a composition in which the concentration of the perovskite compound was 1000 μg/mL and the molar ratio of Si/Pb was 20.0 was obtained by naturally drying the toluene to be evaporated. The composition was cut into a size of 1 cm×1 cm.

The quantum yield before the test for the durability with respect to water vapor was 63%, and the quantum yield after 7 days from the test for the durability with respect to water vapor was 50%. The value of (quantum yield after 7 days from test for durability with respect to water vapor)/(quantum yield before test for durability with respect to water vapor) was 0.79.

Example 6

A composition having a size of 1 cm×1 cm was obtained according to the same method as that of Example 5 except that the molar ratio of Si/Pb was set to 66.8.

The quantum yield before the test for the durability with respect to water vapor was 73%, and the quantum yield after 7 days from the test for the durability with respect to water vapor was 57%. The value of (quantum yield after 7 days from test for durability with respect to water vapor)/(quantum yield before test for durability with respect to water vapor) was 0.78.

Example 7

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, an organopolysilazane (Durazane 1500 Slow Cure, manufactured by Merck Performance Materials Ltd.) was mixed into the above-described dispersion liquid. In the composition, the molar ratio of Si/Pb was 76.0.

The above-described dispersion liquid was subjected to a modification treatment for 1 day while being stirred using a stirrer at 25° C. under a humidity condition of 80%. Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound, the modified product of polysilazane, and the solvent was mixed with 0.913 g of the solution in which the polymer was dissolved to obtain a composition.

Further, a composition in which the concentration of the perovskite compound was 1000 m/mL and the molar ratio of Si/Pb was 76.0 was obtained by naturally drying the toluene to be evaporated. The composition was cut into a size of 1 cm×1 cm.

The quantum yield before the test for the durability with respect to water vapor was 63%, and the quantum yield after 7 days from the test for the durability with respect to water vapor was 55%. The value of (quantum yield after 7 days from test for durability with respect to water vapor)/(quantum yield before test for durability with respect to water vapor) was 0.87.

Example 8

A composition having a size of 1 cm×1 cm was obtained according to the same method as that of Example 7 except that the molar ratio of Si/Pb was set to 228.

The quantum yield before the test for the durability with respect to water vapor was 60%, and the quantum yield after 7 days from the test for the durability with respect to water vapor was 56%. The value of (quantum yield after 7 days from test for durability with respect to water vapor)/(quantum yield before test for durability with respect to water vapor) was 0.93.

Example 9

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide ($PbBr_2$) and 0.208 g of lead iodide ($PbI_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 µL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (µg/g).

Next, an organopolysilazane (Durazane 1500 Rapid Cure, manufactured by Merck Performance Materials Ltd.) was mixed into the above-described dispersion liquid. In the dispersion liquid, the molar ratio of Si/Pb was 10.6.

The above-described dispersion liquid was subjected to a modification treatment for 1 day while being stirred using a stirrer at 25° C. under a humidity condition of 80%.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound, the modified product of polysilazane, and the solvent was mixed with 0.913 g of the solution in which the polymer was dissolved to obtain a composition.

Further, a composition in which the concentration of the perovskite compound was 1000 µg/mL and the molar ratio of Si/Pb was 10.6 was obtained by naturally drying the toluene to be evaporated. The composition was cut into a size of 1 cm×1 cm.

The quantum yield before the test for the durability with respect to water vapor was 58%, and the quantum yield after 3 days from the test for the durability with respect to water vapor was 36%. The value of (quantum yield after 3 days from test for durability with respect to water vapor)/(quantum yield before test for durability with respect to water vapor) was 0.62.

Example 10

A composition having a size of 1 cm×1 cm was obtained according to the same method as that of Example 9 except that the molar ratio of Si/Pb was set to 31.8.

The quantum yield before the test for the durability with respect to water vapor was 64%, and the quantum yield after 3 days from the test for the durability with respect to water vapor was 49%. The value of (quantum yield after 3 days from test for durability with respect to water vapor)/(quantum yield before test for durability with respect to water vapor) was 0.77.

Example 11

A composition having a size of 1 cm×1 cm was obtained according to the same method as that of Example 9 except that the molar ratio of Si/Pb was set to 53.0.

The quantum yield before the test for the durability with respect to water vapor was 65%, and the quantum yield after 3 days from the test for the durability with respect to water vapor was 56%. The value of (quantum yield after 3 days from test for durability with respect to water vapor)/(quantum yield before test for durability with respect to water vapor) was 0.86.

Example 12

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, the dispersion liquid containing the perovskite compound and the solvent was mixed with octamethylcyclotetrasilazane. In the dispersion liquid, the molar ratio of Si/Pb was 91.4.

The above-described dispersion liquid was subjected to a modification treatment for 1 day while being stirred using a stirrer at 25° C. under a humidity condition of 80%.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound, the modified product of octamethylcyclotetrasilazane, and the solvent was mixed with 0.913 g of the solution in which the polymer was dissolved to obtain a composition.

Further, a composition in which the concentration of the perovskite compound was 1000 μg/mL and the molar ratio of Si/Pb was 91.4 was obtained by naturally drying the toluene to be evaporated. The composition was cut into a size of 1 cm×1 cm.

The quantum yield before the test for the durability with respect to water vapor was 36%, and the quantum yield after 5 days from the test for the durability with respect to water vapor was 24%. The value of (quantum yield after 5 days from test for durability with respect to water vapor)/(quantum yield before test for durability with respect to water vapor) was 0.67.

Example 13

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, perhydropolysilazane (AZNN-120-20, manufactured by Merck Performance Materials Ltd.) was mixed into the above-described dispersion liquid. In the dispersion liquid, the molar ratio of Si/Pb was 10.4.

The above-described dispersion liquid was subjected to a modification treatment for 1 day while being stirred using a stirrer at 25° C. under a humidity condition of 80%.

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound, the modified product of polysilazane, and the solvent was mixed with 0.913 g of the solution in which the polymer was dissolved to obtain a composition.

Further, a composition in which the concentration of the perovskite compound was 1000 μg/mL and the molar ratio of Si/Pb was 10.4 was obtained by naturally drying the toluene to be evaporated. The composition was cut into a size of 1 cm×1 cm.

The quantum yield before the test for the durability with respect to water vapor was 50%, and the quantum yield after 5 days from the test for the durability with respect to water vapor was 35%. The value of (quantum yield after 5 days from test for durability with respect to water vapor)/(quantum yield before test for durability with respect to water vapor) was 0.70.

Comparative Example 1

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide ($PbBr_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound the solvent was mixed with 0.913 g of the solution in which the polymer was dissolved in an aluminum cup (4.5 φcm), thereby obtaining a composition.

Further, a composition in which the concentration of the perovskite compound was 1000 μg/mL was obtained by naturally drying the toluene to be evaporated. The composition was cut into a size of 1 cm×1 cm.

The quantum yield before the test for the durability with respect to water vapor was 27%, the quantum yield after 5 days from the test for the durability with respect to water vapor was 9%, and the quantum yield after 7 days from the test for the durability with respect to water vapor was 0%. The value of (quantum yield after 5 days from test for durability with respect to water vapor)/(quantum yield before test for durability with respect to water vapor) was 0.33, and the value of (quantum yield after 7 days from test for durability with respect to water vapor)/(quantum yield before test for durability with respect to water vapor) was 0.

Comparative Example 2

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide (PbBr$_2$) and 0.208 g of lead iodide (PbI$_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound the solvent was mixed with 0.913 g of the solution in which the polymer was dissolved in an aluminum cup (4.5 φcm), thereby obtaining a composition.

Further, a composition in which the concentration of the perovskite compound was 1000 μg/mL was obtained by naturally drying the toluene to be evaporated. The composition was cut into a size of 1 cm×1 cm.

The quantum yield before the test for the durability with respect to water vapor was 25%, and the quantum yield after 3 days from the test for the durability with respect to water vapor was 4%. The value of (quantum yield after 3 days from test for durability with respect to water vapor)/(quantum yield before test for durability with respect to water vapor) was 0.16.

Comparative Example 3

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.276 g of lead bromide (PbBr$_2$) was mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide dispersion liquid.

The lead bromide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 11 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, a methacrylic resin (PMMA, manufactured by Sumitomo Chemical Co., Ltd., SUMIPEX methacrylic resin, MH, molecular weight of approximately 120000, specific gravity of 1.2 g/ml) was mixed with a toluene such that the amount of PMMA reached 16.5% by mass with respect to the total mass of the methacrylic acid and toluene, and the solution was heated at 60° C. for 3 hours to obtain a solution in which the polymer was dissolved.

0.15 g of the dispersion liquid containing the perovskite compound and the solvent was mixed with 0.913 g of the solution in which the polymer was dissolved in an aluminum cup (4.5 ϕcm), and aminopropyltriethoxysilane was mixed into the resulting solution, thereby obtaining a composition. In the composition, the molar ratio of Si/Pb was 28.7.

Further, a composition in which the concentration of the perovskite compound was 1000 μg/mL was obtained by naturally drying the toluene to be evaporated. The composition was cut into a size of 1 cm×1 cm.

The quantum yield before the test for the durability with respect to water vapor was 42%, and the quantum yield after 5 days from the test for the durability with respect to water vapor was 4%. The value of (quantum yield after 5 days from test for durability with respect to water vapor)/(quantum yield before test for durability with respect to water vapor) was 0.095.

The configurations of the compositions of Examples 1 to 13 and Comparative Examples 1 to 3, the quantum yields (%) before and after the test for the durability with respect to water vapor, and the results of the evaluation 1 of the durability of each composition with respect to water vapor are listed in Table 1. The durability with respect to water vapor was evaluated based on the value of (quantum yield after test for durability with respect to water vapor during X' days)/(quantum yield before test for durability with respect to water vapor) as an index of the durability with respect to water vapor. X is 3, 5, or 7. In Table 1, "Si/Pb" indicates the molar ratio obtained by dividing the molar number of Si contained in the composition by the molar number of Pb.

TABLE 1

| | Light-emitting material | Additive | Si/Pb [molar ratio] | Quantum yield [%] (Durability) | | | |
|---|---|---|---|---|---|---|---|
| | | | | Before test | After 3 day | After 5 days | After 7 days |
| Example 1 | $CsPbBr_3$ | Durazane 1500 Rapid Cure | 6.68 | 42% | — | 28% (0.67) | — |
| Example 2 | $CsPbBr_3$ | Durazane 1500 Rapid Cure | 20.0 | 45% | — | 34% (0.76) | — |
| Example 3 | $CsPbBr_3$ | Durazane 1500 Rapid Cure | 66.8 | 50% | — | 31% (0.62) | — |
| Example 4 | $CsPbBr_3$ | Durazane 1500 Slow Cure | 76.0 | 45% | — | 27% (0.60) | — |
| Example 5 | $CsPbBr_3$ | Durazane 1500 Rapid Cure (modified product) | 20.0 | 63% | — | — | 50% (0.79) |
| Example 6 | $CsPbBr_3$ | Durazane 1500 Rapid Cure (modified product) | 66.8 | 73% | — | — | 57% (0.78) |
| Example 7 | $CsPbBr_3$ | Durazane 1500 Slow Cure (modified product) | 76.0 | 63% | — | — | 55% (0.87) |
| Example 8 | $CsPbBr_3$ | Durazane 1500 Slow Cure (modified product) | 228 | 60% | — | — | 56% (0.93) |
| Example 9 | $CsPbBr_{1.2}I_{1.8}$ | Durazane 1500 Rapid Cure (modified product) | 10.6 | 58% | 36% (0.62) | — | — |
| Example 10 | $CsPbBr_{1.2}I_{1.8}$ | Durazane 1500 Rapid Cure (modified product) | 31.8 | 64% | 49% (0.77) | — | — |
| Example 11 | $CsPbBr_{1.2}I_{1.8}$ | Durazane 1500 Rapid Cure (modified product) | 53.0 | 65% | 56% (0.86) | — | — |
| Example 12 | $CsPbBr_3$ | Octamethyl-cyclotetrasilazane (modified product) | 91.4 | 36% | — | 24% (0.67) | — |
| Example 13 | $CsPbBr_3$ | AZNN-120-20 (modified product) | 10.4 | 50% | — | 35% (0.70) | — |

TABLE 1-continued

|  | Light-emitting material | Additive | Si/Pb [molar ratio] | Quantum yield [%] (Durability) | | | |
|---|---|---|---|---|---|---|---|
|  |  |  |  | Before test | After 3 day | After 5 days | After 7 days |
| Comparative Example 1 | CsPbBr$_3$ | — | — | 27% | — | 9% (0.33) | 0% (0) |
| Comparative Example 2 | CsPbBr$_{1.2}$I$_{1.8}$ | — | — | 25% | 4% (0.16) | — | — |
| Comparative Example 3 | CsPbBr$_3$ | Aminopropyltriethoxysilane | 28.7 | 42% | — | 4% (0.095) | — |

As shown in the results described above, it was confirmed that each composition of Examples 1 to 13 to which the present invention was applied had a higher initial quantum yield and excellent durability with respect to water vapor than those of each composition of Comparative Examples 1 to 3 to which the present invention was not applied.

(Measurement of Concentration of Perovskite Compound)

The concentration of each composition obtained in Examples 14 to 16 and Comparative Example 4 was adjusted to 200 ppm (µg/g) using toluene. The concentration of the perovskite compound in each composition obtained in the examples and the comparative examples was obtained by adding N,N-dimethylformamide to the dispersion liquid containing the solvent and the perovskite compound which was obtained by re-dispersion, dissolving the perovskite compound therein, and measuring the concentration using ICP-MS (ELAN DRCII, manufactured by PerkinElmer, Inc.) and ion chromatography (Integrion, manufactured by ThermoFisher Scientific Inc.).

(Measurement of Quantum Yield)

The quantum yield of each composition obtained in Examples 14 to 16 and Comparative Example 4 was measured with excitation light having a wavelength of 450 nm at room temperature in the atmosphere using an absolute PL quantum yield measuring device (C9920-02, manufactured by Hamamatsu Photonics K. K.). Further, the measurement sample was prepared such that the concentration of the perovskite compound with respect to the total mass of the composition was set to 200 ppm using toluene.

(Measurement of Emission Spectrum)

The emission spectrum of each composition obtained in Examples 14 to 16 and Comparative Example 4 was measured with excitation light having a wavelength of 450 nm at room temperature in the atmosphere using an absolute PL quantum yield measuring device (C9920-02, manufactured by Hamamatsu Photonics K. K.). Further, the measurement sample was prepared such that the concentration of the perovskite compound with respect to the total mass of the composition was set to 1000 µg/mL.

(Evaluation 2 of Durability with Respect to Water Vapor)

Each composition obtained in Examples 14 to 16 and Comparative Example 4 was placed in a thermohygrostat bath under a constant condition of a temperature of 25° C. and a humidity of 80%, and the emission spectrum was measured after 1 day with excitation light having a wavelength of 450 nm at room temperature in the atmosphere using an absolute PL quantum yield measuring device (C9920-02, manufactured by Hamamatsu Photonics K. K.).

The durability was evaluated based on the absolute value of (peak wavelength (nm) of emission spectrum before test for durability with respect to water vapor)−(peak wavelength (nm) of emission spectrum after test for durability with respect to water vapor during 1 day) as an index of the durability with respect to water vapor.

Example 14

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide (PbBr$_2$) and 0.208 g of lead iodide (PbI$_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the cesium carbonate solution was added to the dispersion liquid. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 µL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (µg/g).

Next, an organopolysilazane (Durazane 1500 Rapid Cure, manufactured by Merck Performance Materials Ltd.) was mixed into the above-described dispersion liquid to obtain a composition. In the composition, the molar ratio of Si/Pb was 10.6. The peak wavelength of the emission spectrum before the test for the durability with respect to water vapor was 638 nm, and the peak wavelength of the emission spectrum after 1 day from the test for the durability with respect to water vapor was 649 nm.

The absolute value of (peak wavelength (nm) of emission spectrum before test for durability with respect to water vapor)−(peak wavelength (nm) of emission spectrum after test for durability with respect to water vapor for 1 day) was 11.

The quantum yield before the test for the durability with respect to water vapor was 59%.

Example 15

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide ($PbBr_2$) and 0.208 g of lead iodide ($PbI_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, an organopolysilazane (Durazane 1500 Rapid Cure, manufactured by Merck Performance Materials Ltd.) was mixed into the above-described dispersion liquid to obtain a composition. In the composition, the molar ratio of Si/Pb was 31.8.

The peak wavelength of the emission spectrum before the test for the durability with respect to water vapor was 638 nm, and the peak wavelength of the emission spectrum after 1 day from the test for the durability with respect to water vapor was 641 nm. The absolute value of (peak wavelength (nm) of emission spectrum before test for durability with respect to water vapor)−(peak wavelength (nm) of emission spectrum after test for durability with respect to water vapor for 1 day) was 3.

The quantum yield before the test for the durability with respect to water vapor was 53%.

Example 16

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide ($PbBr_2$) and 0.208 g of lead iodide ($PbI_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

Next, an organopolysilazane (Durazane 1500 Rapid Cure, manufactured by Merck Performance Materials Ltd.) was mixed into the above-described dispersion liquid to obtain a composition. In the composition, the molar ratio of Si/Pb was 53.0.

The peak wavelength of the emission spectrum before the test for the durability with respect to water vapor was 638 nm, and the peak wavelength of the emission spectrum after 1 day from the test for the durability with respect to water vapor was 640 nm. The absolute value of (peak wavelength (nm) of emission spectrum before test for durability with respect to water vapor)−(peak wavelength (nm) of emission spectrum after test for durability with respect to water vapor for 1 day) was 2.

The quantum yield before the test for the durability with respect to water vapor was 41%.

Comparative Example 4

0.814 g of cesium carbonate, 40 mL of a solvent of 1-octadecene, and 2.5 mL of oleic acid were mixed. A cesium carbonate solution was prepared by stirring the solution using a magnetic stirrer and heating the resulting solution at 150° C. for 1 hour while circulating nitrogen.

0.110 g of lead bromide ($PbBr_2$) and 0.208 g of lead iodide ($PbI_2$) were mixed into 20 mL of a solvent of 1-octadecene. 2 mL of oleic acid and 2 mL of oleylamine were added to the solution after the solution was stirred using a magnetic stirrer and heated at a temperature of 120° C. for 1 hour while nitrogen was circulated, thereby preparing a lead bromide-lead iodide dispersion liquid.

The lead bromide-lead iodide dispersion liquid was heated to a temperature of 160° C., and 1.6 mL of the above-described cesium carbonate solution was added thereto. After the addition, a dispersion liquid was obtained by immersing a reaction container in ice water such that the temperature was decreased to room temperature.

Next, a precipitate was separated by performing centrifugation on the dispersion liquid at 10000 rpm for 5 minutes to obtain a perovskite compound as a precipitate.

As determined by measurement performed on the X-ray diffraction pattern of the perovskite compound using an X-ray diffraction measuring device (XRD, Cu Kα ray, X'pert PRO MPD, manufactured by Spectris plc), it was confirmed that a peak derived from (hkl)=(001) at a position where 2θ was 14° and a three-dimensional perovskite type crystal structure were present.

The average Feret diameter (average particle diameter) of the perovskite compound measured using a TEM (JEM-2200FS, manufactured by JEOL Ltd.) was 19 nm.

The obtained perovskite compound was dispersed in 5 mL of toluene, 500 μL of a dispersion liquid was taken out, and the compound was re-dispersed in 4.5 mL of toluene to obtain a dispersion liquid containing the perovskite compound and the solvent.

The concentration of the perovskite compound with respect to the total mass of the dispersion liquid measured using ICP-MS and ion chromatography was 1500 ppm (μg/g).

The peak wavelength of the emission spectrum before the test for the durability with respect to water vapor was 638 nm, and the peak wavelength of the emission spectrum after 1 day from the test for the durability with respect to water vapor was 576 nm. The absolute value of (peak wavelength (nm) of emission spectrum before test for durability with respect to water vapor)−(peak wavelength (nm) of emission spectrum after test for durability with respect to water vapor for 1 day) was 62. The quantum yield before the test for the durability with respect to water vapor was 26%.

The configurations of the compositions of Examples 14 to 16 and Comparative Example 4 and the peak wavelengths (nm) of the emission spectra are listed in Table 2. In Table 2, "Si/Pb" indicates the molar ratio obtained by dividing the molar number of Si contained in the composition by the molar number of Pb.

TABLE 2

| | Light-emitting material | Additive | Si/Pb [molar ratio] | Quantum yield | Peak wavelength of emission spectrum [nm] | | |
|---|---|---|---|---|---|---|---|
| | | | | | Before test | After 1 day | Durability |
| Example 14 | $CsPbBr_{1.2}I_{1.8}$ | Durazane 1500 Rapid Cure | 10.6 | 59% | 638 | 649 | 11 |
| Example 15 | $CsPbBr_{1.2}I_{1.8}$ | Durazane 1500 Rapid Cure | 31.8 | 53% | 638 | 641 | 3 |
| Example 16 | $CsPbBr_{1.2}I_{1.8}$ | Durazane 1500 Rapid Cure | 53.0 | 41% | 638 | 640 | 2 |
| Comparative Example 4 | $CsPbBr_{1.2}I_{1.8}$ | — | — | 26% | 638 | 576 | 62 |

As shown in the results described above, it was confirmed that each composition of Examples 14 to 16 to which the present invention was applied had excellent durability with respect to water vapor and an excellent effect of improving the quantum yield than those of the composition of Comparative Example 4 to which the present invention was not applied.

Reference Example 1

A backlight that is capable of converting blue light of a blue light-emitting diode to green light or red light by putting each composition of Examples 1 to 13 into a glass tube or the like so as to be sealed and disposing the glass tube or the like between a light-guiding plate and the blue light-emitting diode serving as a light source is produced.

Reference Example 2

A backlight that is capable of converting blue light to be applied to a sheet after passing through a light-guiding plate from a blue light-emitting diode placed on an end surface (side surface) of the light-guiding plate to green light or red light by forming the sheet using each composition of Examples 1 to 13 and placing a film obtained by interposing the sheet between two barrier films so as to be sealed on the light-guiding plate is produced.

Reference Example 3

A backlight that is capable of converting blue light to be applied to green light or red light by placing each composition of Examples 1 to 13 in the vicinity of a light-emitting unit of a blue light-emitting diode is produced.

Reference Example 4

A wavelength conversion material can be obtained by mixing each composition of Examples 14 to 16 with a resist and removing the solvent. A backlight that is capable of converting blue light from a light source to green light or red light by disposing the obtained wavelength conversion material between the blue light-emitting diode serving as a light source and a light-guiding plate and on a back stage of an OLED serving as a light source is produced.

Reference Example 5

An LED is obtained by mixing each composition of Examples 14 to 16 with conductive particles such as ZnS to form a film, laminating an n-type transport layer on one surface of the film, and laminating a p-type transport layer on the other surface thereof. The LED is allowed to emit light by circulating the current so that positive holes of the p-type semiconductor and electrons of the n-type semiconductor cancelled the charge in the semiconductor fine particles of the bonding surface.

Reference Example 6

A solar cell is prepared by laminating a titanium oxide dense layer on a surface of a fluorine-doped tin oxide (FTO) substrate, laminating a porous aluminum oxide layer thereon, laminating each composition of Examples 14 to 16 thereon, laminating a hole transport layer such as 2,2',7,7'-tetrakis-(N,N'-di-p-methoxyphenylamine)-9,9'-spirobifluorene (Spiro-OMeTAD) thereon after the solvent is removed, and laminating a silver (Ag) layer thereon.

Reference Example 7

A laser diode illumination emitting white light by converting blue light applied from a blue light-emitting diode to a resin molded body to green light or red light is produced by mixing each composition of Examples 14 to 16 with a resin, removing the solvent for molding to obtain the resin composition containing the composition according to the present invention, and placing the resin composition on a back stage of the blue light-emitting diode.

Reference Example 8

A laser diode illumination emitting white light by converting blue light applied from a blue light-emitting diode to a resin molded body to green light or red light is produced by placing each composition of Examples 1 to 13 on a back stage of the blue light-emitting diode.

INDUSTRIAL APPLICABILITY

According to the present invention, it is possible to provide a composition containing a perovskite compound which has a high initial quantum yield and excellent durability with respect to water vapor, a method for producing the composition, a film formed of the composition, a laminated structure containing the composition, and a display obtained by using the composition.

Therefore, the composition of the present invention, the film formed of the composition, the laminated structure containing the composition, and the display obtained by using the composition can be suitably used for light emission.

REFERENCE SIGNS LIST

1a: first laminated structure
1b: second laminated structure
10: film
20: first substrate
21: second substrate
22: sealing layer
2: light-emitting device
3: display
30: light source
40: liquid crystal panel
50: prism sheet
60: light-guiding plate

What is claimed is:

1. A light-emitting composition comprising:
a perovskite compound (1) comprising
a metal ion,
a monovalent cation positioned at each vertex of a hexahedron having the metal ion at the center in a perovskite type crystal structure, and
at least one anion selected from the group consisting of a halide ion and a thiocyanate ion, the anion being positioned at each vertex of an octahedron having the metal ion at the center in the perovskite type crystal structure;
a silazane or modified product thereof (2); and
a polymerizable compound or polymer (4),
wherein the composition is formed by mixing the perovskite compound (1), the silazane or the modified product thereof (2), and the polymerizable compound or polymer (4).

2. The composition according to claim 1,
wherein the silazane or modified product thereof (2) comprises a polysilazane or a modified product thereof.

3. The composition according to claim 1, further comprising:
solvent (3).

4. The composition according to claim 1, further comprising:
at least one compound or ion (5) selected from the group consisting of ammonia, an amine, a carboxylic acid, and salts and ions thereof.

5. The composition according to claim 1,
wherein the polymerizable compound or polymer (4) is a polymer (4'), and
wherein a total content ratio of the perovskite compound (1), the silazane or modified product thereof (2), and the polymer (4') is 90% by mass or greater with respect to the total mass of the composition.

6. The composition according to claim 5, further comprising:
at least one compound or ion (5) selected from the group consisting of ammonia, an amine, a carboxylic acid, and salts and ions thereof.

7. A film which is formed of the composition according to claim 5.

8. A laminated structure comprising:
the film according to claim 7.

9. A light-emitting device comprising:
the laminated structure according to claim 8.

10. A display comprising:
the laminated structure according to claim 8.

11. A method for producing the composition of claim 5, comprising:
dispersing the perovskite compound (1) in a solvent (3) to obtain a dispersion liquid;
mixing the dispersion liquid with a polymerizable compound or polymer (4) to obtain a mixed solution; and
mixing the mixed solution with the silazane or modified product (2).

12. The composition according to claim 5, wherein the metal ion comprises one or more metal ions selected from the group consisting of lead and tin.

13. The composition according to claim 5, wherein the polymer comprises an acrylic resin.

14. The light-emitting composition according to claim 1, wherein the metal ion comprises one or more metal ions selected from the group consisting of lead and tin.

15. The light-emitting composition according to claim 1, further comprising:
- at least one compound selected from the group consisting of ammonia, an amine, a carboxylic acid, and salts or ions thereof, and wherein the polymerizable compound or polymer (4) is acrylic acid ester, methacrylic acid ester, or an acrylic resin.

16. The light-emitting composition according to claim 1, wherein the monovalent cation comprises at least one ion selected from the group consisting of a cesium ion, an organic ammonium ion, and an amidinium ion.

17. The light-emitting composition according to claim 1, wherein the anion comprises the halide ion.

18. A method for producing a composition, comprising:
- a step of dispersing a perovskite compound (1) which includes constituent components A, B, and X in a solvent (3) to obtain a dispersion liquid;
- a step of mixing the dispersion liquid with a silazane (2') to obtain a mixed solution;
- a step of performing a modification treatment on the mixed solution to obtain a mixed solution containing a modified product of silazane; and
- a step of mixing the mixed solution containing the modified product of silazane with a polymerizable compound or polymer (4); wherein
- the constituent component A indicates a component positioned at each vertex of a hexahedron having the constituent component B at the center in a perovskite type crystal structure and is a monovalent cation,
- the constituent component X indicates a component positioned at each vertex of an octahedron having the constituent component B at the center in the perovskite type crystal structure and is at least one anion selected from the group consisting of a halide ion and a thiocyanate ion, and
- the constituent component B indicates a component positioned at the centers of the hexahedron where the constituent component A is disposed at each vertex and the octahedron where the constituent component X is disposed at each vertex in the perovskite type crystal structure and is a metal ion.

19. A light-emitting composition comprising:
- a perovskite compound (1) comprising
  - a metal ion,
  - a monovalent cation positioned at each vertex of a hexahedron having the metal ion at the center in a perovskite type crystal structure, and
  - at least one anion selected from the group consisting of a halide ion and a thiocyanate ion, the anion being positioned at each vertex of an octahedron having the metal ion at the center in the perovskite type crystal structure; and
- a silazane or modified product thereof (2),
- wherein a content ratio of the silazane or modified product thereof (2) with respect to a total mass of the composition is 7.5% by mass or less.

20. The light-emitting composition according to claim 19, further comprising:
- a polymer (4'), and
- wherein a total content ratio of the perovskite compound (1), the silazane or modified product thereof (2), and the polymer (4') is 90% by mass or greater with respect to the total mass of the composition.

* * * * *